(12) United States Patent
Hopkins

(10) Patent No.: US 12,543,311 B2
(45) Date of Patent: Feb. 3, 2026

(54) ELECTRONIC DEVICES COMPRISING BLOCKING REGIONS, AND RELATED ELECTRONIC SYSTEMS AND METHODS

(71) Applicant: Micron Technology, Inc., Boise, ID (US)

(72) Inventor: John D. Hopkins, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 691 days.

(21) Appl. No.: 17/823,276

(22) Filed: Aug. 30, 2022

(65) Prior Publication Data

US 2024/0074178 A1 Feb. 29, 2024

(51) Int. Cl.
*H10B 43/27* (2023.01)
*H01L 21/285* (2006.01)
*H10B 41/27* (2023.01)
*H10B 43/10* (2023.01)

(52) U.S. Cl.
CPC .......... *H10B 43/27* (2023.02); *H10B 41/27* (2023.02); *H01L 21/28518* (2013.01); *H10B 43/10* (2023.02)

(58) Field of Classification Search
CPC ........ H10B 43/27; H10B 43/23; H10B 43/20; H10B 43/10; H10B 43/35; H10B 41/27; H10B 41/23; H10B 41/20; H10B 41/10; H10B 41/35; H01L 21/76877; H01L 23/5283
See application file for complete search history.

(56) References Cited

U.S. PATENT DOCUMENTS

| | | | |
|---|---|---|---|
| 9,741,737 B1 | 8/2017 | Huang et al. | |
| 10,854,627 B1 * | 12/2020 | Moriyama | H10D 30/63 |
| 2018/0122906 A1 | 5/2018 | Yu et al. | |
| 2021/0143167 A1 | 5/2021 | Howder et al. | |
| 2021/0257387 A1 | 8/2021 | Huang et al. | |
| 2021/0358938 A1 | 11/2021 | Hopkins | |
| 2021/0358939 A1 | 11/2021 | Hopkins et al. | |
| 2021/0375903 A1 | 12/2021 | Hopkins | |
| 2021/0376083 A1 | 12/2021 | Greenlee et al. | |

(Continued)

OTHER PUBLICATIONS

Hopkins et al., Integrated Assemblies, and Methods of Forming Integrated Assemblies, filed Dec. 18, 2020, U.S. Appl. No. 17/126,777, 66 pages.

(Continued)

*Primary Examiner* — Jose R Diaz
(74) *Attorney, Agent, or Firm* — TraskBritt

(57) ABSTRACT

An electronic device comprising one or more blocking regions. The electronic device also comprises a source stack comprising one or more conductive materials, a source contact vertically adjacent to the source stack, and a doped semiconductive material vertically adjacent to the source contact. Tiers of alternating conductive materials and dielectric materials are vertically adjacent to the doped semiconductive material, and pillars extend through the tiers of alternating conductive materials and dielectric materials, the doped semiconductive material, and the source contact and into the source stack. The one or more blocking regions are laterally adjacent to the semiconductive material. Additional electronic devices, electronic systems, and methods are also disclosed.

25 Claims, 30 Drawing Sheets

(56) References Cited

U.S. PATENT DOCUMENTS

2021/0384208 A1 12/2021 Hopkins et al.
2021/0384216 A1 12/2021 Greenlee et al.

OTHER PUBLICATIONS

Hopkins et al., Methods of Forming Microelectronic Devices, and Related Microelectronic Devices, and Electronic Systems, filed Sep. 4, 2020, U.S. Appl. No. 17/012,741, 56 pages.
Hopkins et al., Microelectronic Devices Including Cap Structures, and Related Electronic Systems and Methods, filed Dec. 27, 2021, U.S. Appl. No. 63/266,027, 71 pages.
Howder et al., Microelectronic Devices Including Filled Slits and Memory Cell Pillars, and Related Memory Devices, Electronic Systems, and Methods, filed Apr. 16, 2021, U.S. Appl. No. 17/233,158, 46 pages.
Lindemann et al., Electronic Devices Comprising a Dielectric Material, and Related Systems and Methods, filed Jan. 26, 2021, U.S. Appl. No. 17/158,918, 55 pages.
Liu et al., Microelectronic Devices With Vertically Recessed Channel Structures and Discrete, Spaced Inter-Slit Structures, and Related Methods and Systems, filed Jan. 26, 2021, U.S. Appl. No. 17/158,888, 92 pages.

\* cited by examiner

ELECTRONIC DEVICES COMPRISING BLOCKING REGIONS, AND RELATED ELECTRONIC SYSTEMS AND METHODS

TECHNICAL FIELD

Embodiments of the disclosure relate to the field of electronic device design and fabrication. More particularly, the disclosure relates to electronic devices having at least one blocking region laterally adjacent to a doped semiconductive material, and to related electronic systems and methods for forming the electronic devices.

BACKGROUND

Memory devices provide data storage for electronic systems. A Flash memory device is one of various memory type and has numerous uses in modern computers and other electrical devices. A conventional Flash memory device may include a memory array that has a large number of charge storage devices (e.g., memory cells, such as non-volatile memory cells) arranged in rows and columns. In a NAND architecture type of Flash memory, memory cells arranged in a column are coupled in series, and a first memory cell of the column is coupled to a data line (e.g., a bit line). In a three-dimensional (3D) NAND memory device, not only are the memory cells arranged in rows and columns in a horizontal array, but tiers of the horizontal arrays are stacked over one another (e.g., as vertical strings of memory cells) to provide a 3D array of the memory cells. The stack of tiers vertically alternate conductive materials with dielectric materials, with the conductive materials functioning as access lines (e.g., word lines) and gate structures (e.g., control gates) for the memory cells. Pillars comprising channels and tunneling structures extend along and form portions of the memory cells of individual vertical strings of memory cells. A drain end of a string is adjacent one of the top or bottom of the pillar, while a source end of the string is adjacent the other of the top or bottom of the pillar. The drain end is operably connected to a bit line, and the source end is operably connected to a source line. A 3D NAND memory device also includes electrical connections between, e.g., access lines (e.g., word lines) and other conductive structures of the device so that the memory cells of the vertical strings can be selected for writing, reading, and erasing operations.

In processes of forming conventional 3D NAND memory devices, multiple polysilicon materials are used and contact between the channels and other electrically conductive components of the memory devices is achieved by a laterally-oriented, doped polysilicon material. However, the presence of multiple polysilicon materials may cause processing challenges, such as overetching, of other materials in the 3D NAND memory devices.

DETAILED DESCRIPTION

Figure 1:
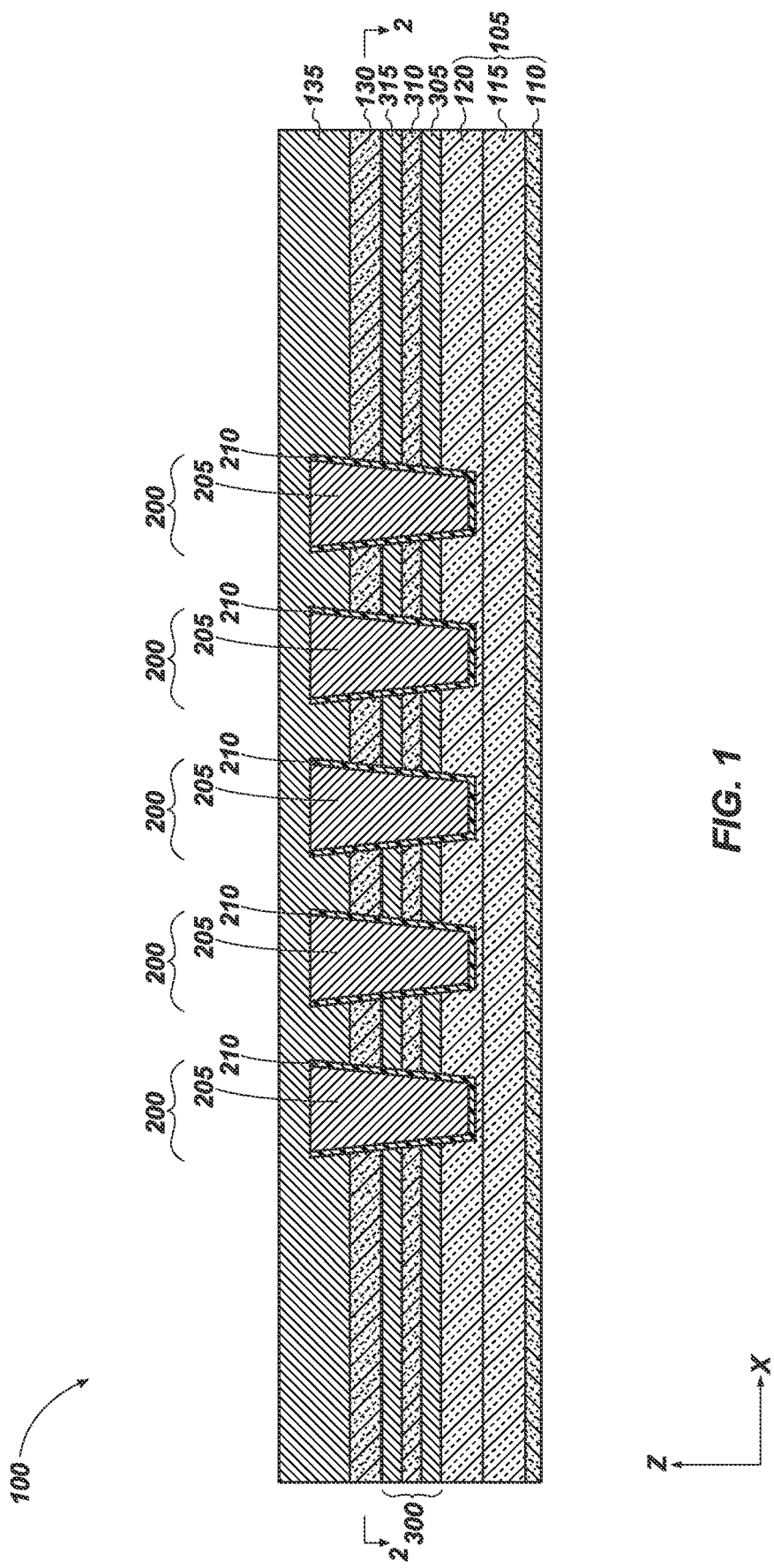
FIGS. 1, 3, 5-7, 9-11, and 13-15 are partial cross-sectional views

Electronic devices (e.g., apparatus, electronic devices) and systems (e.g., electronic systems) according to embodiments of the disclosure include one or more blocking regions laterally adjacent to a doped semiconductive material, which is adjacent to (e.g., vertically adjacent to) a source contact. The blocking region may include first and second blocking regions, with one or both of the first and second blocking regions protecting the doped semiconductive material during processing of the electronic device. The doped semiconductive material is protected by the blocking region during removal of other materials of the electronic device. The blocking region may also provide additional process margin for removing (e.g., etching) materials of the electronic device. The blocking region is formed adjacent to the doped semiconductive material by converting at least a portion of the doped semiconductive material into the blocking region, which comprises a metal material or a metallized polysilicon material. The source contact is adjacent to (e.g., vertically adjacent to) the blocking region.

Fabrication of the electronic device includes forming and removing multiple sacrificial structures during the formation of the source contact, including a slit sacrificial structure and a source contact sacrificial structure. A slit opening is formed through the slit sacrificial structure to expose the source contact sacrificial structure, which is removed and replaced with the source contact in a desired location. The blocking region may protect the doped semiconductive material during the formation of the slit opening, the removal of the slit sacrificial structure, and the removal of the source contact sacrificial structure. Therefore, the doped semiconductive material is protected from overetching. In contrast to conventional electronic devices, the electronic devices according to embodiments of the disclosure include the blocking region above the source contact. Additionally, in contrast to conventional electronic devices, the electronic devices according to embodiments of the disclosure include the blocking region within the doped semiconductive material, which is laterally adjacent to the fill material subsequently formed in the slit opening.

The following description provides specific details, such as material types, material thicknesses, and process conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete description of an electronic device or a complete process flow for manufacturing the electronic device and the structures described below do not form a complete electronic device. Only those process acts and structures necessary to understand the embodiments described herein are described in detail below. Additional acts to form a complete electronic device may be performed by conventional techniques.

The fabrication processes described herein do not form a complete process flow for processing apparatus (e.g., devices, systems) or the structures thereof. The remainder of the process flow is known to those of ordinary skill in the art. Accordingly, only the methods and structures necessary to understand embodiments of the present apparatus (e.g., devices, systems) and methods are described herein.

Unless the context indicates otherwise, the materials described herein may be formed by any suitable technique including, but not limited to, spin coating, blanket coating, chemical vapor deposition ("CVD"), atomic layer deposition ("ALD"), plasma enhanced ALD, physical vapor deposition ("PVD") (e.g., sputtering), epitaxial growth, or ion implanting (e.g., plasma doping ion implantation). Alternatively, the materials may be grown in situ. Depending on the specific material to be formed, the technique for depositing or growing the material may be selected by a person of ordinary skill in the art unless the context indicates otherwise. The removal of materials may be accomplished by any suitable technique including, but not limited to, etching (e.g., dry etching, wet etching, vapor etching), ion milling, abrasive planarization (e.g., chemical-mechanical planarization), or other known methods unless the context indicates otherwise.

Drawings presented herein are for illustrative purposes only, and are not meant to be actual views of any particular material, component, structure, electronic device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, the singular forms "a," "an," and "the" are intended to include the plural forms as well, unless the context clearly indicates otherwise.

As used herein, "and/or" includes any and all combinations of one or more of the associated listed items.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the terms "comprising," "including," "containing," "characterized by," and grammatical equivalents thereof are inclusive or open-ended terms that do not exclude additional, unrecited elements or method steps, but also include the more restrictive terms "consisting of" and "consisting essentially of" and grammatical equivalents thereof.

As used herein, the term "conductive material" means and includes an electrically conductive material. The conductive material may include, but is not limited to, one or more of a doped polysilicon, undoped polysilicon, a metal, an alloy, a conductive metal oxide, a conductive metal nitride, a conductive metal silicide, and a conductively doped semiconductor material. By way of example only, the conductive material may be one or more of tungsten (W), tungsten nitride ($WN_y$), nickel (Ni), tantalum (Ta), tantalum nitride ($TaN_y$), tantalum silicide ($TaSi_x$), platinum (Pt), copper (Cu), silver (Ag), gold (Au), aluminum (Al), molybdenum (Mo), titanium (Ti), titanium nitride ($TiN_y$), titanium silicide ($TiSi_x$), titanium silicon nitride ($TiSi_xN_y$), titanium aluminum nitride ($TiAl_xN_y$), molybdenum nitride ($MoN_x$), iridium (Ir), iridium oxide ($IrO_z$), ruthenium (Ru), ruthenium oxide ($RuO_z$), n-doped polysilicon, p-doped polysilicon, undoped polysilicon, and conductively doped silicon, where x, y, or z are integers or non-integers.

As used herein, the term "configured" refers to a size, shape, material composition, and arrangement of one or more of at least one structure and at least one apparatus facilitating operation of one or more of the structure and the apparatus in a pre-determined way.

As used herein, the phrase "coupled to" refers to structures operably connected with each other, such as electrically connected through a direct ohmic connection or through an indirect connection (e.g., via another structure).

As used herein, the term "dielectric material" means and includes an electrically insulative material. The dielectric material may include, but is not limited to, one or more of an insulative oxide material, an insulative nitride material, an insulative oxynitride material, an insulative carboxynitride material, and/or air. A dielectric oxide material may be an oxide material, a metal oxide material, or a combination thereof. The dielectric oxide material may include, but is not limited to, a silicon oxide ($SiO_x$, silicon dioxide ($SiO_2$)), phosphosilicate glass (PSG), borosilicate glass (BSG), borophosphosilicate glass (BPSG), fluorosilicate glass (FSG), aluminum oxide ($AlO_x$), barium oxide, gadolinium oxide ($GdO_x$), hafnium oxide ($HfO_x$), magnesium oxide ($MgO_x$), molybdenum oxide, niobium oxide ($NbO_x$), strontium oxide, tantalum oxide ($TaO_x$), titanium oxide ($TiO_x$), yttrium oxide, zirconium oxide ($ZrO_x$), hafnium silicate, a dielectric oxynitride material (e.g., $SiO_xN_y$), a dielectric carbon nitride material (SiCN), a dielectric carboxynitride material (e.g., $SiO_xC_zN_y$), a combination thereof, or a combination of one or more of the listed materials with silicon oxide, where values of "x," "y," and "z" may be integers or may be non-integers. A dielectric nitride material may include, but is not limited to, silicon nitride. A dielectric oxynitride material may include, but is not limited to, a silicon oxynitride ($SiO_xN_y$). A dielectric carboxynitride material may include, but is not limited to, a silicon carboxynitride ($SiO_xC_zN_y$). The dielectric material may be a stoichiometric compound or a non-stoichiometric compound.

As used herein, the term "electronic device" includes, without limitation, a memory device, as well as semiconductor devices which may or may not incorporate memory, such as a logic device, a processor device, or a radiofrequency (RF) device. Further, an electronic device may incorporate memory in addition to other functions such as, for example, a so-called "system on a chip" (SoC) including a processor and memory, or an electronic device including logic and memory. The electronic device may, for example, be a 3D electronic device, such as a 3D NAND Flash memory device.

As used herein, the term "may" with respect to a material, structure, feature or method act indicates that such is contemplated for use in implementation of an embodiment of the disclosure and such term is used in preference to the more restrictive term "is" so as to avoid any implication that other, compatible materials, structures, features and methods usable in combination therewith should or must be excluded.

As used herein, the term "neighboring," when referring to a material or structure, means and refers to a next, most proximate material or structure of an identified composition or characteristic. Materials or structures of other compositions or characteristics than the identified composition or characteristic may be disposed between one material or structure and its "neighboring" material or structure of the identified composition or characteristic. For example, a structure of material X "neighboring" a structure of material Y is the first material X structure, e.g., of multiple material X structures, that is next most proximate to the particular structure of material Y. The "neighboring" material or structure may be directly or indirectly proximate the structure or material of the identified composition or characteristic.

As used herein, reference to an element as being "on" or "over" another element means and includes the element being directly on top of, adjacent to (e.g., laterally adjacent to, vertically adjacent to), underneath, or in direct contact with the other element. It also includes the element being indirectly on top of, adjacent to (e.g., laterally adjacent to, vertically adjacent to), underneath, or near the other element, with other elements present therebetween. In contrast, when an element is referred to as being "directly on" or "directly adjacent to" another element, no intervening elements are present.

As used herein, the terms "opening" and "slit" mean and include a volume extending through at least one structure or at least one material, leaving a void (e.g., gap) in the at least one structure or at least one material, or a volume extending between structures or materials, leaving a gap between the structures or materials. Unless otherwise described, the opening and/or slit is not necessarily empty of material. That is, an opening and/or slit is not necessarily void space. An opening and/or slit formed in or between structures or materials may comprise structure(s) or material(s) other than that in or between which the opening and/or slit is formed. And, structure(s) or material(s) "exposed" within an opening and/or slit is (are) not necessarily in contact with an atmosphere or non-solid environment. Structure(s) or material(s) exposed within an opening and/or slit may be adjacent or in contact with other structure(s) or material(s) that is (are) disposed within the opening and/or slit.

As used herein, the term "sacrificial," when used in reference to a material or a structure, means and includes a material or structure that is formed during a fabrication process but at least a portion of which is removed (e.g., substantially removed) prior to completion of the fabrication process. The sacrificial material or sacrificial structure may be present in some portions of the electronic device and absent in other portions of the electronic device.

As used herein, the terms "selectively removable" or "selectively etchable" mean and include a material that exhibits a greater etch rate responsive to exposure to a given etch chemistry and/or process conditions (collectively referred to as etch conditions) relative to another material exposed to the same etch chemistry and/or process conditions. For example, the material may exhibit an etch rate that is at least about five times greater than the etch rate of another material, such as an etch rate of about ten times greater, about twenty times greater, or about forty times greater than the etch rate of the another material. Etch chemistries and process conditions for selectively removing (e.g., selectively etching) a desired material may be selected by a person of ordinary skill in the art.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, or even at least 99.9% met.

As used herein, the term "substrate" means and includes a material (e.g., a base material) or construction upon which additional materials or components, such as those within memory cells, are formed. The substrate may be an electronic substrate, a semiconductor substrate, a base semiconductor layer on a supporting structure, an electrode, an electronic substrate having one or more materials, layers, structures, or regions formed thereon, or a semiconductor substrate having one or more materials, layers, structures, or regions formed thereon. The materials on the electronic substrate or semiconductor substrate may include, but are not limited to, semiconductive materials, insulating materials, conductive materials, etc. The substrate may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped. Furthermore, when reference is made to a "substrate" or "base material" in the following description, previous process acts may have been conducted to form materials or structures in or on the substrate or base material.

As used herein, the terms "vertical," "longitudinal," "horizontal," and "lateral" are in reference to a major plane of a structure and are not necessarily defined by Earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure.

FIGS. 1 through 16 are simplified, partial cross sectional and partial top-down views illustrating different processing stages of a method of forming an electronic device (e.g., a memory device, such as a 3D NAND Flash memory device), in accordance with embodiments of the disclosure. With the description provided below, it will be readily apparent to one of ordinary skill in the art that the methods described herein may be used for forming various devices. Therefore, the methods of the disclosure may be used whenever it is desired to form an electronic device.

Figure 2:
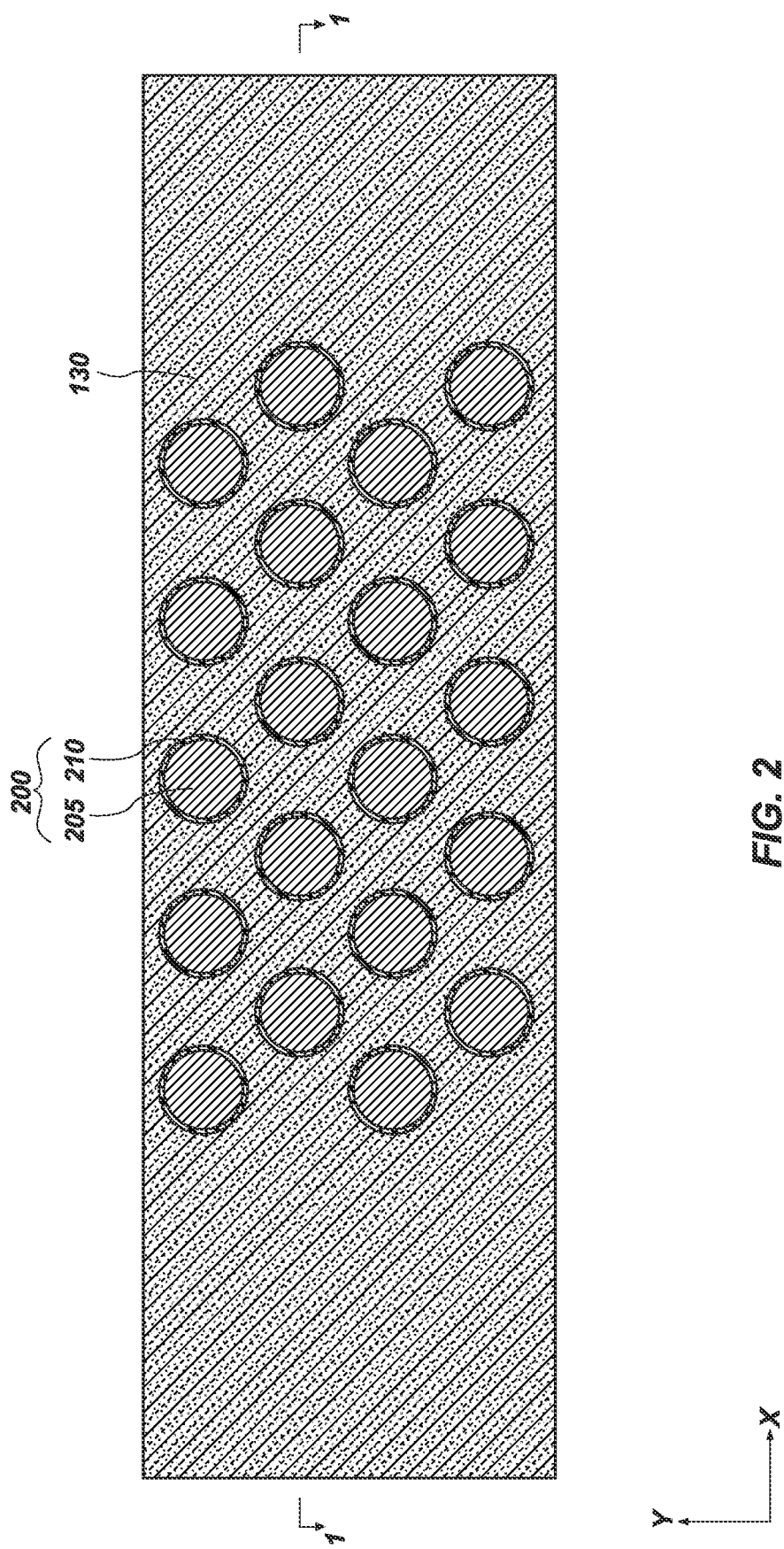
FIGS. 2, 4, 8, 12, and 16 are partial top-down views illustrating a method of forming electronic devices in accordance with embodiments of the disclosure.

FIG. 1 is a partial cross-sectional schematic illustration taken through the line 1-1 in FIG. 2, and FIG. 2 is a partial cross-sectional top-down schematic illustration taken through the line 2-2 in FIG. 1. As shown in FIG. 1, the source stack 105 may be formed adjacent to a base material (not shown) and includes one or more conductive materials, with a conductive liner material 110 formed vertically adjacent to the base material, the source material 115 formed vertically adjacent to the conductive liner material 110, and the semiconductive material 120 formed vertically adjacent to the source material 115. In some embodiments, the conductive liner material 110 is formed of and includes titanium nitride, the source material 115 is formed of and includes tungsten silicide ($WSi_x$), and the semiconductive material 120 is formed of and includes a doped polysilicon material. However, the conductive liner material 110, the source material 115, and the semiconductive material 120 may be formed of and include other conductive materials. Each of the conductive liner material 110, source material 115, and semiconductive material 120 may be formed by conventional techniques and to a desired thickness. By way of example only, the conductive liner material 110 may be formed to a thickness of from about 200 Å to about 400 Å, the source material 115 may be formed to a thickness of from about 800 Å to about 1000 Å, and the semiconductive material 120 may be formed to a thickness of from about 2000 Å to about 4000 Å.

A source contact sacrificial structure 300 is formed over the source stack 105, as shown in FIG. 1. The source contact sacrificial structure 300 may include a first sacrificial structure 305, a second sacrificial structure 310, and a third sacrificial structure 315, each of which may be formed by conventional techniques. Materials of the first sacrificial structure 305, the second sacrificial structure 310, and the third sacrificial structure 315 may be selectively etchable relative to one another and relative to other materials of an electronic device structure 100. The first sacrificial structure 305 and the third sacrificial structure 315 may include the same material (e.g., the same chemical composition) or may include a different material (e.g., a different chemical composition). By way of example only, the first sacrificial structure 305, the second sacrificial structure 310, and the third sacrificial structure 315 may be dielectric materials, such as a silicon oxide material or a silicon nitride material, that are selectively etchable. In some embodiments, the first sacrificial structure 305 is a highly conformal silicon dioxide, the second sacrificial structure 310 is silicon nitride, and the third sacrificial structure 315 is tetraethylorthosilicate (TEOS). In other embodiments, the second sacrificial structure 310 is a polysilicon material (e.g., a doped polysilicon material). However, other combinations of dielectric materials and semiconductive materials that are selectively etchable may be used. In addition, the source contact sacrificial structure 300 may be formed of and include two materials or more than three materials. As is discussed in greater detail below, removal of one or more materials of the source contact sacrificial structure 300 provides lateral access for a subsequently formed source contact 125 (see FIG. 15) to contact pillars 160 that include memory cells. The source contact 125 is electrically coupled to the pillars 160.

Figure 14:
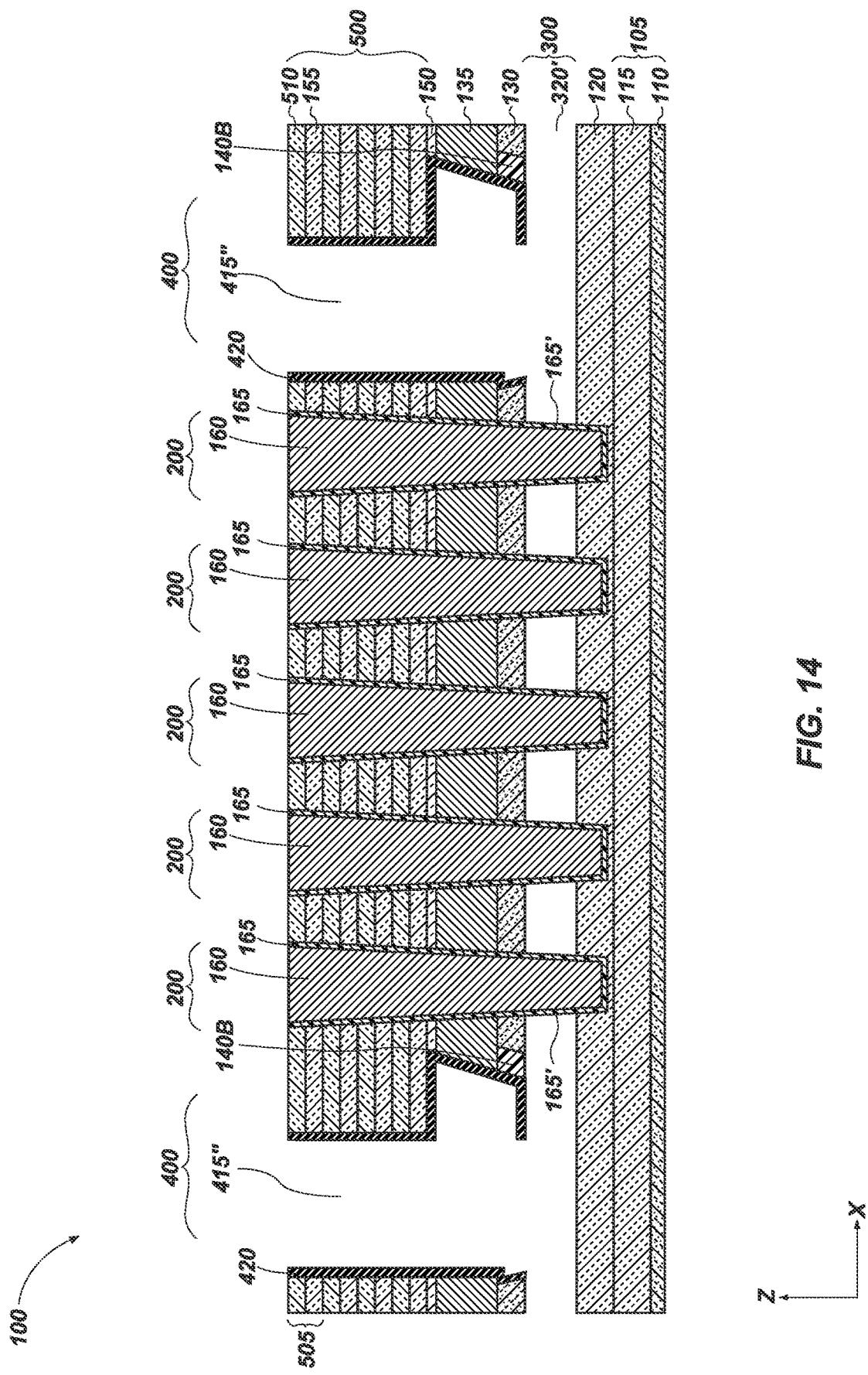
Figure 15:
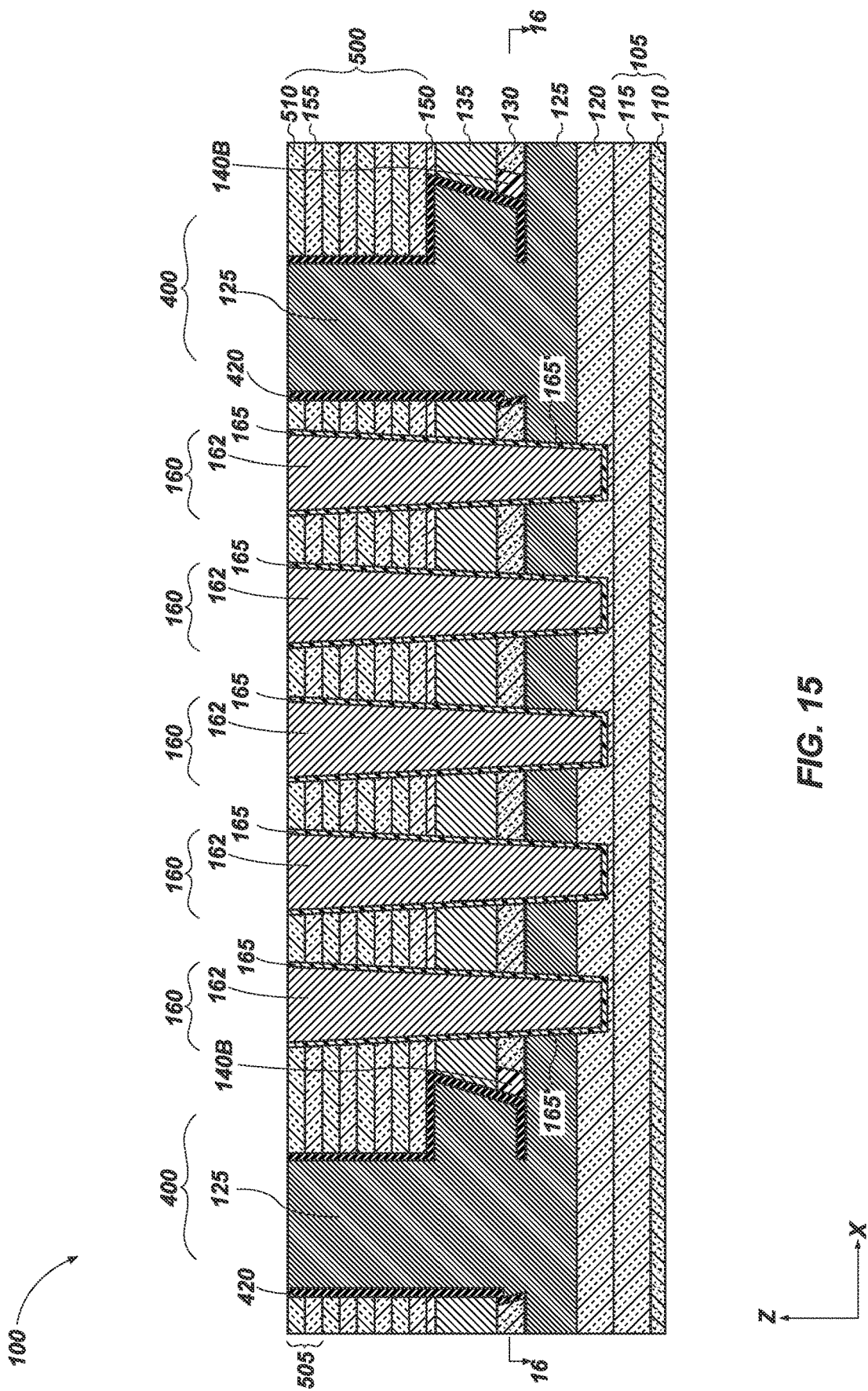

A location of the source contact sacrificial structure 300 corresponds to the location at which the source contact 125 is ultimately formed, and a total thickness of the as-formed source contact sacrificial structure 300 may be determined by a desired thickness of the source contact 125 (see FIGS. 14 and 15). Individual thicknesses of each of the first sacrificial structure 305, the second sacrificial structure 310, and the third sacrificial structure 315 may be selected based on the desired thickness of the source contact 125. By way of example only, the first sacrificial structure 305 may be formed to a thickness of from about 30 Å to about 400 Å, the second sacrificial structure 310 may be formed to a thickness of from about 100 Å to about 300 Å, and the third sacrificial structure 315 may be formed to a thickness of from about 30 Å to about 200 Å. The thickness of each of the first sacrificial structure 305, the second sacrificial structure 310, and the third sacrificial structure 315 may be sufficient to protect cell film materials of the pillars 160 and the source stack 105 during subsequently conducted process acts that provide access to the pillars 160 by sequentially removing portions of the cell films.

A doped semiconductive material 130 may be formed on (e.g., formed vertically adjacent to) the source contact sacrificial structure 300 and may be formed by conventional techniques. The doped semiconductive material 130 may include a polysilicon material and may be selectively etchable relative to other material of the electronic device structure 100. A thickness of the doped semiconductive material 130 may be from about 400 Å to about 1000 Å, such as from about 400 Å to about 600 Å, from about 450 Å to about 550 Å, from about 450 Å to about 700 Å, from about 500 Å to about 700 Å, from about 600 Å to about 800 Å, from about 700 Å to about 900 Å, or from about 800 Å to about 1000 Å. The thickness of the doped semiconductive material 130 may be selected depending on a desired distance between the source contact 125 and a select gate source (SGS) (not shown) of a tier stack 500 (see FIG. 6). The thickness of the doped semiconductive material 130 may be sufficient to separate (e.g., physically separate) the source contact 125 from the SGS by a desired distance. In some embodiments, the thickness of the doped semiconductive material 130 is about 500 Å. The doped semiconductive material 130 may function as an offset between the source stack 105 and tiers 505 (see FIG. 6) during the fabrication of the electronic device structure 100.

An insulative cap material 135 may be formed on (e.g., formed vertically adjacent to) the doped semiconductive material 130 and may be formed by conventional techniques. The insulative cap material 135 may include a conventional dielectric material, such as a silicon oxide material or a silicon nitride material.

Figure 7:
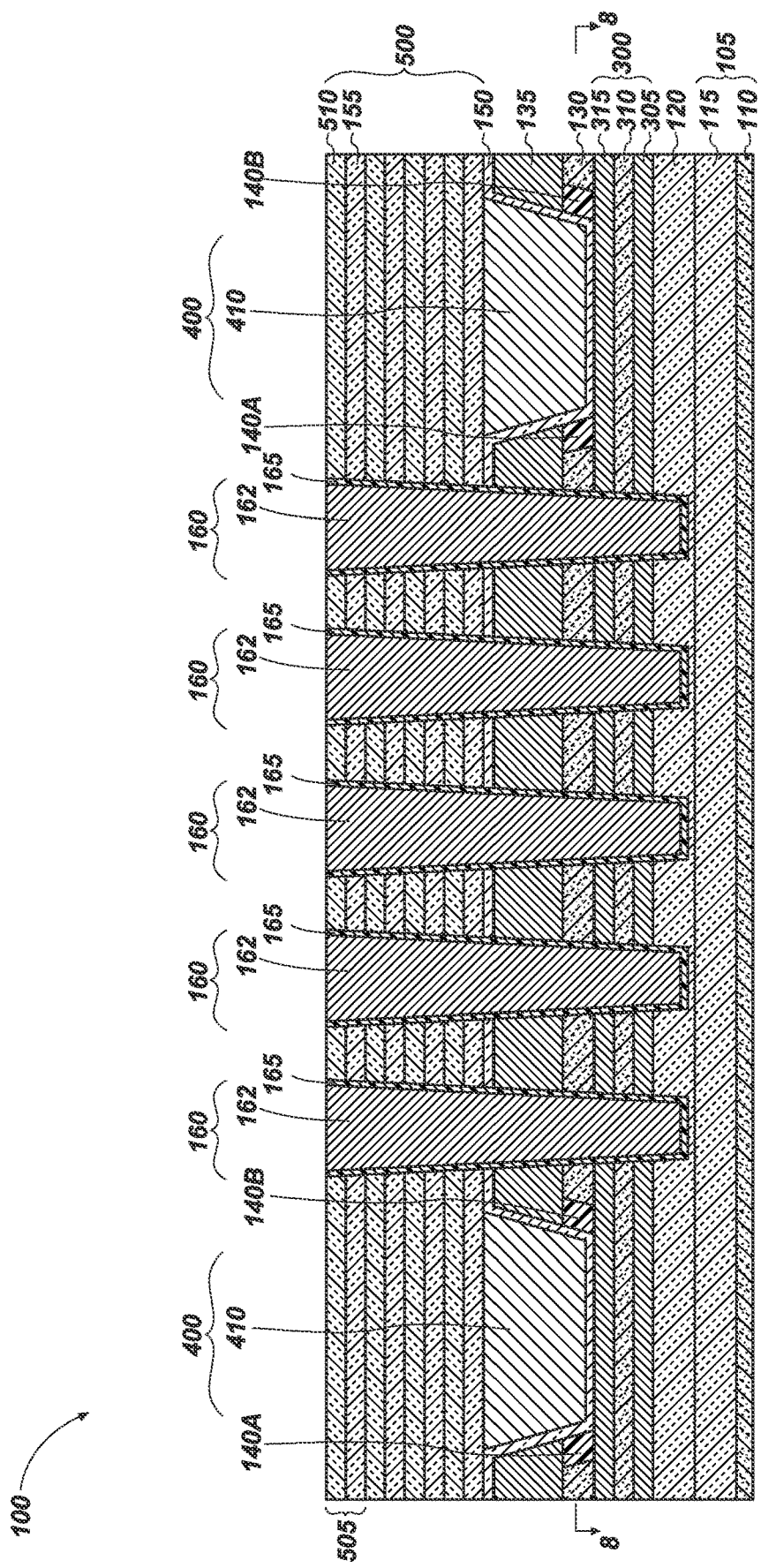

Referring still to FIGS. 1 and 2, sacrificial pillar structures 200 may extend vertically through at least a portion of the insulative cap material 135, through the doped semiconductive material 130 and the source contact sacrificial structure 300, and partially through (e.g., into) the semiconductive material 120 of the source stack 105. The sacrificial pillar structures 200 may include a first liner material 210 and a sacrificial pillar etch stop 205, which are disposed within a recess. The sacrificial pillar structures 200 may be arranged in groups of staggered rows of sacrificial pillar structures 200 and laterally spaced from one another. The first liner material 210 may include one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$, at least one dielectric nitride material (e.g., $SiN_y$), at least one dielectric oxynitride material (e.g., $SiO_xN_y$), at least one dielectric carboxynitride material (e.g., $SiO_xC_zN_y$), or amorphous carbon. In some embodiments, the first liner material 210 comprises $SiO_2$. The sacrificial pillar etch stop 205 may include tungsten or a tungsten-containing material. The sacrificial pillar etch stop 205 may function as an etch stop during formation of the pillars 160 (e.g., memory cells) (FIG. 7). The first liner material 210 and the sacrificial pillar etch stop 205 of the sacrificial pillar structures 200 may be formed by conventional techniques.

Figure 3:
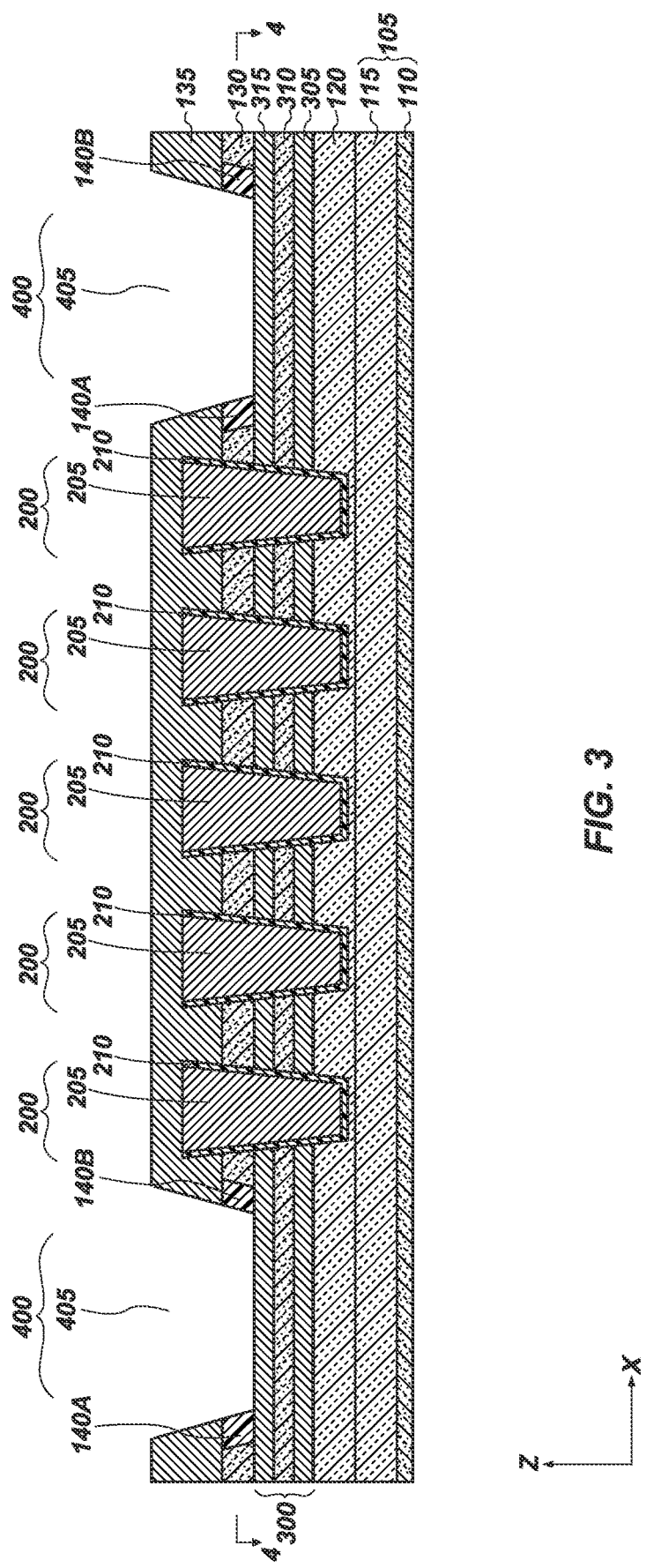
Figure 4:
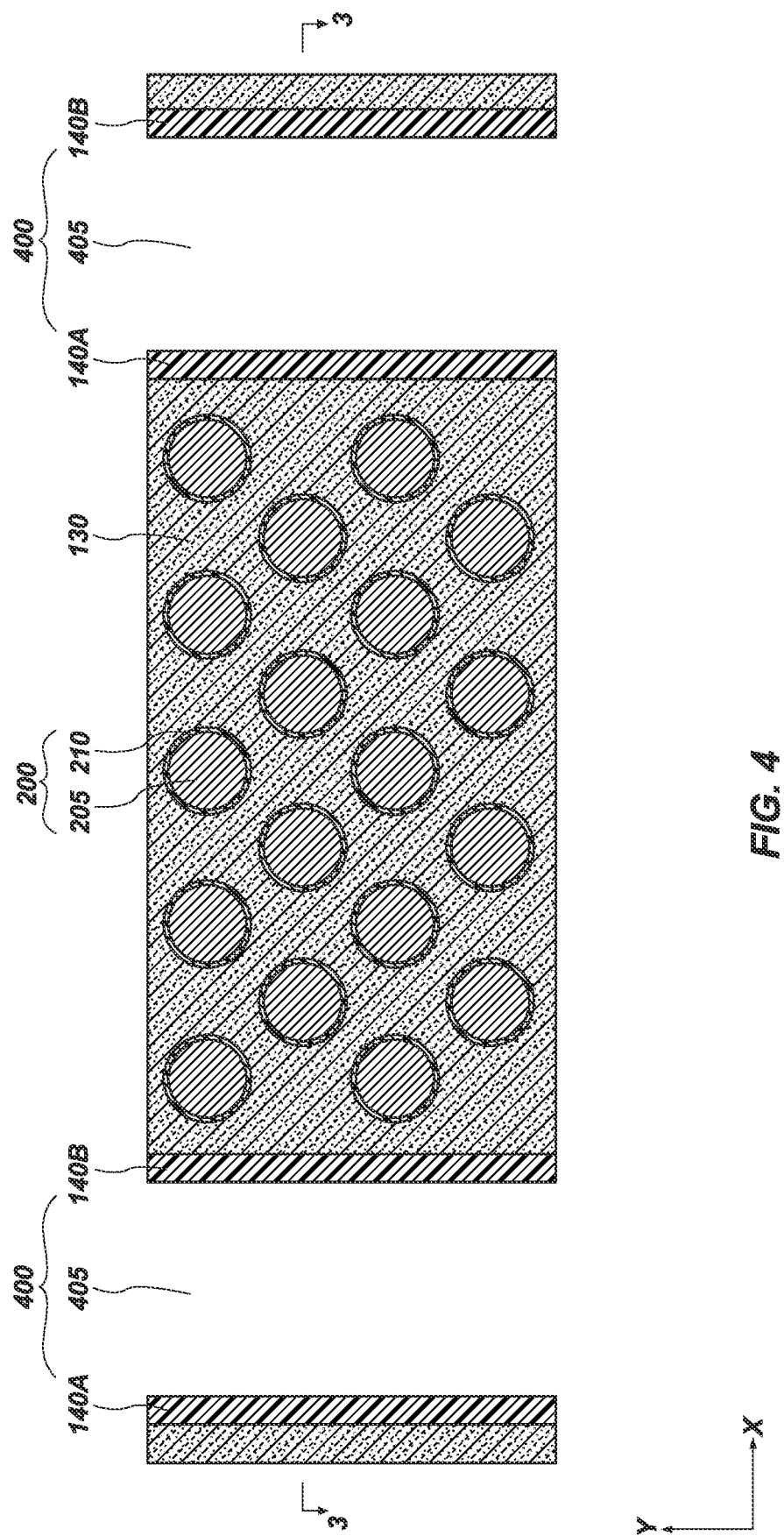

Referring to FIGS. 3 and 4, a recess 405 may be formed through the insulative cap material 135 and the doped semiconductive material 130. The recess 405 may be formed via conventional methods. The recess 405 may terminate at or within the third sacrificial structure 315 of the source contact sacrificial structure 300 and may be defined by sidewalls of the insulative cap material 135 and the doped semiconductive material 130. For instance, the recess 405 may be formed by a removal process (e.g., an etch process) that removes the insulative cap material 135 and the doped semiconductive material 130. The etch process may be conducted by adjusting one or more of the etch chemistry and the process conditions, such as a duration of the etch process. Forming the recess 405 exposes portions of the insulative cap material 135 and the doped semiconductive material 130.

An exposed portion of the doped semiconductive material 130 is converted into a first blocking region 140A and a second blocking region 140B (collectively referred to herein as "blocking region 140"). The blocking region 140 is located adjacent to a lower portion of the recess 405. The blocking region 140 may be selectively removable (e.g., selectively etchable) relative to the doped semiconductive material 130. The blocking region 140 may be a metallized material of the doped semiconductive material 130. The first blocking region 140A and the second blocking region 140B may have a lateral width along a horizontal direction (e.g., the X-direction) of between about 2.0 nm and about 15.0 nm. By way of example, the first blocking region 140A and the second blocking region 140B may have a lateral width along a horizontal direction of about 7.5 nm. The lateral width of the first blocking region 140A and the second blocking region 140B may be substantially the same, with the first blocking region 140A and the second blocking region 140B extending symmetrically (e.g., the same distance) away from the recess 405. The blocking region 140 may be formed by converting the exposed portion of the doped semiconductive material 130 laterally adjacent to the bottom of the recess 405 into a tungsten-containing material or a titanium-containing material. Dopants may also be present in the blocking region 140. Alternatively, the blocking region 140 may be substantially free of dopants.

The blocking region 140 may laterally extend proximal to the sacrificial pillar structures 200, with the blocking region 140 remaining separated from an adjacent sacrificial pillar structure 200 by a portion of the doped semiconductive material 130. In other words, at least some of the doped semiconductive material 130 may remain between the sacrificial pillar structures 200 and the blocking region 140. Therefore, the blocking region 140 does not directly contact the sacrificial pillar structures 200 laterally adjacent to the recess 405.

The blocking region 140 may, for example, be titanium (Ti), titanium silicide ($TiSi_x$), titanium cobalt silicide ($TiCoSi_x$), tungsten (W), tungsten silicide ($WSi_x$), tungsten nitride silicide ($WNSi_x$), or a combination thereof, where x is an integer or a non-integer. The material of the blocking region 140 may be a stoichiometric compound or a non-stoichiometric compound. By way of example, the blocking region 140 may be formed of and include W. Alternatively, the blocking region 140 may be formed of and include tungsten silicide ($WSi_x$). The blocking region 140 may be substantially homogeneous in chemical composition or may include a heterogeneous chemical composition, such as exhibiting a chemical composition having a gradient of silicon (e.g., silicon atoms). A portion of the blocking region 140 proximal to the doped semiconductive material 130 (e.g., an interfacial region of the blocking region 140) may exhibit a different chemical composition than a portion of the blocking region 140 distal to the doped semiconductive material 130 (e.g., proximal to the recess 405). The chemical composition of the blocking region 140 may be selected to have a composition that is Si rich (e.g., W:Si is greater than or equal to 1:2), or Si poor (e.g., W:Si is less than 1:2). If the blocking region 140 includes a homogeneous composition, the first blocking region 140A and second blocking region 140B may be $WSi_x$. If the blocking region 140 includes a heterogeneous composition, the portion of the blocking region 140 proximal to the doped semiconductive material 130 may include $WSi_x$, and the portion of the blocking region 140 distal to the doped semiconductive material 130 may include W, with a gradient of silicon in the $WSi_x$ in between the $WSi_x$ portion and the W portion.

The first blocking region 140A and the second blocking region 140B are formed by exposing the doped semiconductive material 130 to one or more chemical species facilitating the conversion of the doped semiconductive material 130 (e.g., silicon material, polysilicon material) into the tungsten-containing material (e.g., alpha (a) phase tungsten, beta ((3) phase tungsten, $WSi_x$) or into the titanium-containing material. The chemical species may be a metal compound, such as a metal halide. By exposing the doped semiconductive material 130 to the metal compound, the metal is incorporated into the doped semiconductive material 130. Therefore, the blocking region 140 is a metallized material (e.g., a metallized silicon-containing material) of the doped semiconductive material 130. By way of non-limiting example, if the doped semiconductive material 130 comprises polysilicon, the polysilicon may be exposed to tungsten hexafluoride ($WF_6$) or other tungsten halide compound to form the first blocking region 140A and the second blocking region 140B at desired locations adjacent to the recess 405. Silicon (Si) atoms of the doped semiconductive material 130 may react with the $WF_6$ to produce W and silicon tetrafluoride ($SiF_4$). The produced $SiF_4$ is removed as a gas. The W remains in the first blocking region 140A and the second blocking region 140B laterally neighboring the recess 405 and doped semiconductive material 130, and vertically neighboring the insulative cap material 135 and the third sacrificial structure 315. Substantially all of the exposed portion of the doped semiconductive material 130 may be converted to W. Alternatively, only a portion of the exposed portion of the doped semiconductive material 130 may be converted to W. The dopants may also be present in the first blocking region 140A and the second blocking region 140B. The first blocking region 140A and second blocking region 140B may, for example, be exposed to $WF_6$ using a conventional CVD apparatus at a temperature within a range from about 200° C. to about 500° C. Similarly, if the first blocking region 140A and second blocking region 140B are to be the titanium-containing material, the doped semiconductive material 130 may be exposed to a titanium halide compound in place of the tungsten halide compound.

In some embodiments, the first blocking region 140A and second blocking region 140B comprises tungsten. In some embodiments, the first blocking region 140A and second blocking region 140B comprises β-phase tungsten, which has a metastable, A15 cubic structure. Grains of the β-phase tungsten may exhibit generally columnar shapes. Tungsten included within the first blocking region 140A and second blocking region 140B may only be present in the β-phase, or may be present in the β-phase and in the α-phase. In some embodiments, the tungsten of the first blocking region 140A and second blocking region 140B consists essentially of β-phase tungsten and is substantially free of α-phase tungsten. Halide atoms (e.g., chlorine atoms) from the tungsten halide compound or the titanium halide compound may remain in the first blocking region 140A and second blocking region 140B in the form of, for example, a tungsten halide or a titanium halide.

If present in the first blocking region 140A and second blocking region 140B, the α-phase tungsten has a metastable, body-centered cubic structure. Grains of the α-phase tungsten may exhibit generally isometric shapes. If the first blocking region 140A and second blocking region 140B include β-phase tungsten and α-phase tungsten, an amount of β-phase tungsten included in the first blocking region 140A and second blocking region 140B may be different than the amount of α-phase tungsten included in the first blocking region 140A and second blocking region 140B, or may be substantially the same as the amount of α-phase tungsten included in the first blocking region 140A and second blocking region 140B. In some embodiments, the amount of β-phase tungsten in the first blocking region 140A and second blocking region 140B is greater than the amount of α-phase tungsten in the first blocking region 140A and second blocking region 140B. For example, at least a majority (e.g., greater than 50 percent by volume, such as greater than or equal to about 60 percent, greater than or equal to about 70 percent, greater than or equal to about 80 percent, greater than or equal to about 90 percent, greater than or equal to about 95 percent, or greater than or equal to about 99 percent) of the tungsten included in the first blocking region 140A and second blocking region 140B may be present in the β-phase.

Figure 5:
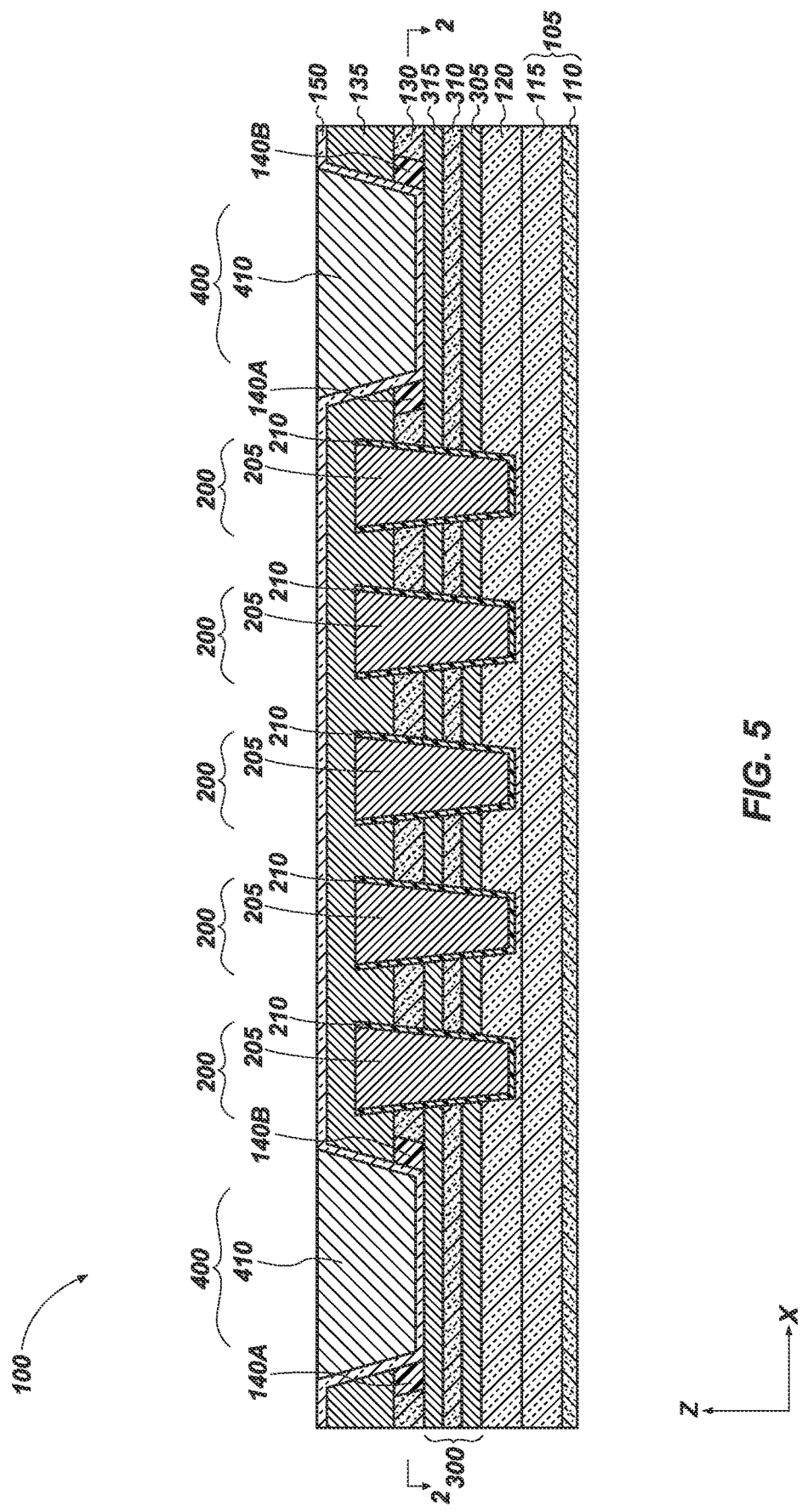

Referring to FIG. 5, a second liner material 150 may, optionally, be formed within the recess 405 and a remaining volume of the recess 405 filled with an etch stop material 410 to form a slit sacrificial structure 400. The etch stop material 410 may be configured as a plug. The second liner material 150, if present, and the etch stop material 410 may be deposited via conventional techniques. Excess second liner material 150 and/or etch stop material 410 may be removed, such as from upper surfaces of the insulative cap material 135, via conventional techniques such as, for example, e.g., an abrasive planarization process (e.g., a CMP process), dry etching, wet etching, vapor etching, or ion milling. Therefore, the upper surfaces of the insulative cap material 135 may be substantially coplanar with upper surfaces of the second liner material 150 and the etch stop material 410. Alternatively, the upper surfaces of the second liner material 150 and the etch stop material 410 may be substantially coplanar with one another. As a non-limiting example, the second liner material 150 may be a titanium nitride material, and the etch stop material 410 may be tungsten or a tungsten-containing material. The slit sacrificial structure 400 may be formed of and include one or more materials that are selective etchable relative to materials of subsequently formed tiers 505 (see FIG. 6). Alternatively, the slit sacrificial structure 400 may be formed of a single material, such as aluminum oxide, two materials, or more than three materials as long as the material(s) provide the desired etch selectivity and etch stop functions. The slit sacrificial structure 400 may also function as an etch stop during subsequent process acts. A location of the slit sacrificial structure 400 may generally horizontally align with a horizontal location at which a slit opening 415 (see FIG. 9) may be subsequently formed.

Figure 6:
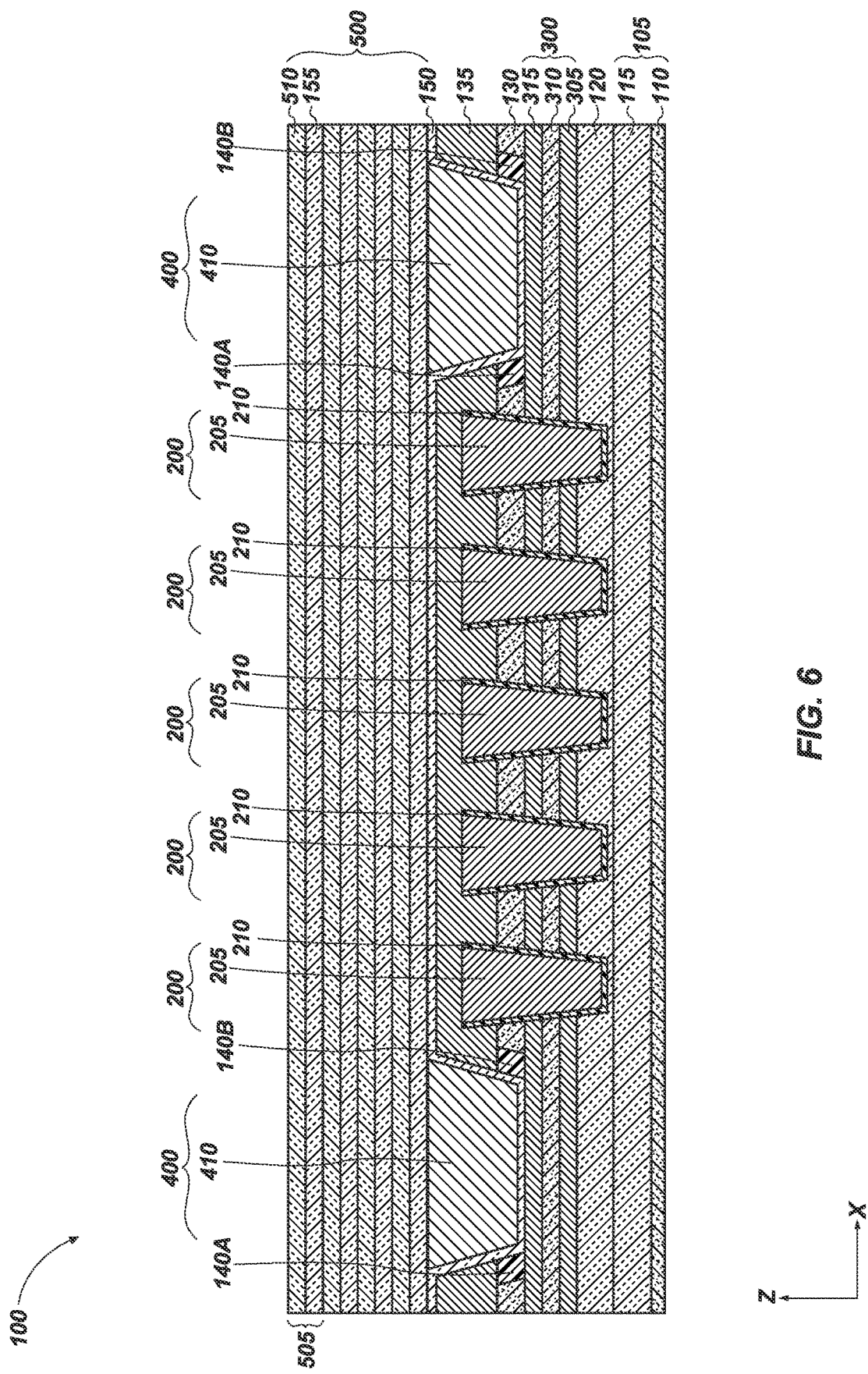

Referring to FIG. 6, tiers 505 of alternating insulating structures 510 and additional insulating structures 155 are formed adjacent to (e.g., on) the insulative cap material 135. The tiers 505 may be formed by conventional techniques. The etch stop material 410 may be formed of and include a material that is selectively etchable relative to the materials of the tiers 505.

Pillar openings (not shown) are formed through the tiers 505, through the sacrificial pillar structures 200, and at least partially into the semiconductive material 120, exposing surfaces of the tiers 505, the doped semiconductive material 130, the source contact sacrificial structure 300, and the semiconductive material 120. The sacrificial pillar etch stop 205 and first liner material 210 of the sacrificial pillar structures 200 are substantially removed during the formation of the pillar openings. The pillar openings may be formed by conventional techniques, such as by conventional photolithography and removal processes, such as a conventional dry etch process.

Figure 8:
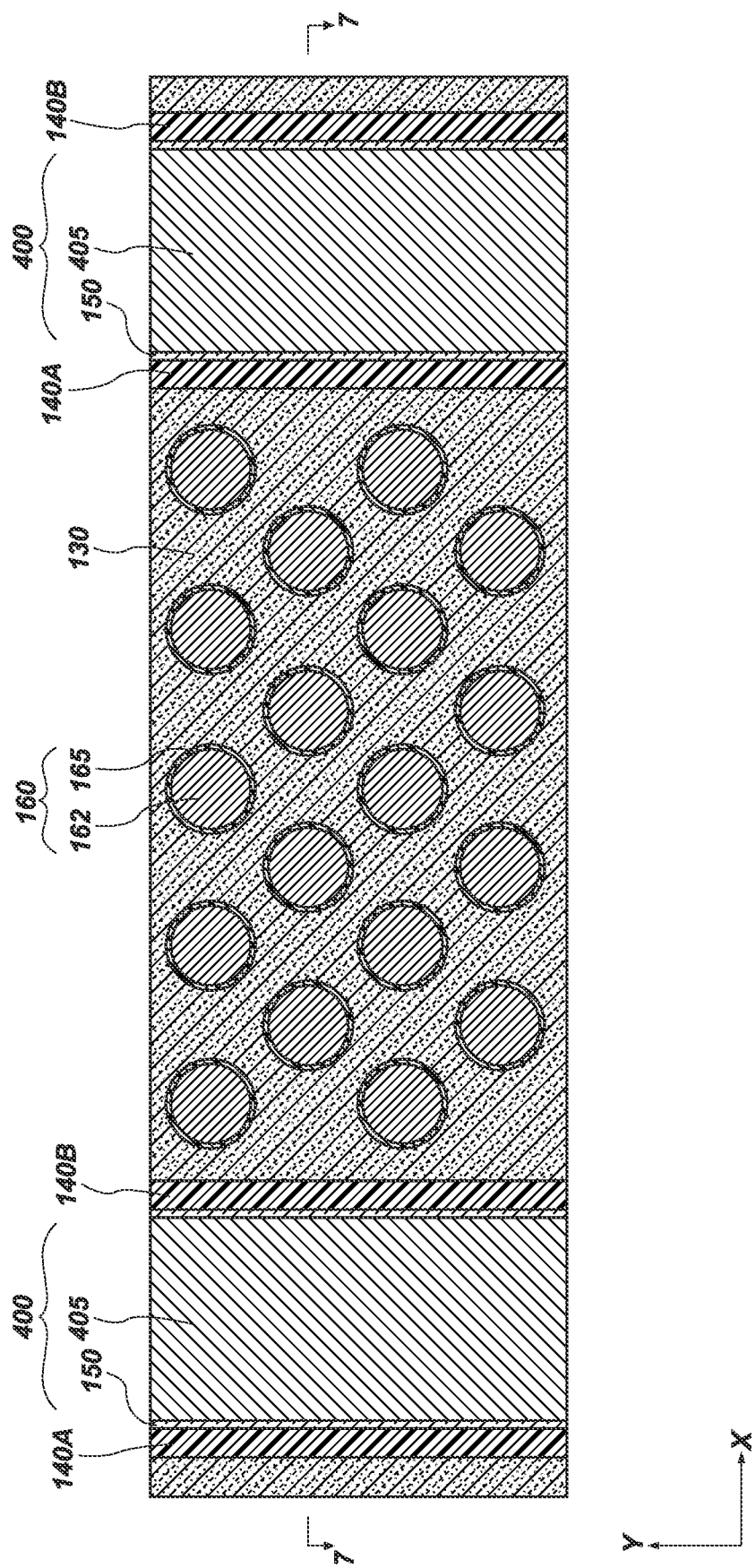

Referring to FIGS. 7 and 8, cell films 165 may be conformally formed in the pillar openings by conventional techniques. A first fill structure 162 may be formed in a remaining volume of the pillar openings, with the cell films 165 and the first fill structure 162 forming pillars 160. The cell films 165 are shown in the drawings as being a single material for simplicity. However, the cell films 165 may include multiple materials, such as a charge blocking material, a charge trap material, a tunnel dielectric material, and a channel. Each of these materials may be formed using conventional techniques. One or more voids may optionally be present in the interior of the first fill structure 162. The charge blocking material, the charge trap material, the tunnel dielectric material, and the channel of the cell films 165 are positioned in order from the outermost material to an innermost material relative to an axial centerline of the pillars 160. As shown in FIG. 7, the pillars 160 are distributed between slit sacrificial structures 400. By way of example only, the pillars 160 may be arranged in groups of staggered rows of pillars 160 and laterally spaced from one another substantially similar to the lateral distribution of the sacrificial pillar structures 200.

The charge blocking material of the cell films 165 may be formed of and include a dielectric material. By way of example only, the charge blocking material may be one or more of an oxide (e.g., silicon dioxide), a nitride (silicon nitride), and an oxynitride (silicon oxynitride), or another material. In some embodiments, the charge blocking material is silicon dioxide. The charge trap material of the cell films 165 may be formed of and include at least one memory material and/or one or more conductive materials. The charge trap material may be formed of and include one or more of silicon nitride, silicon oxynitride, polysilicon (doped polysilicon), a conductive material (e.g., tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof), a semiconductive material (e.g., polycrystalline or amorphous semiconductor material, including at least one elemental semiconductor element and/or including at least one compound semiconductor material, such as conductive nanoparticles (e.g., ruthenium nanoparticles) and/or metal dots). In some embodiments, the charge trap material is silicon nitride. The tunnel dielectric material of the cell films 165 may include one or more dielectric materials, such as one or more of a silicon nitride material or a silicon oxide material. In some embodiments, the tunnel dielectric material is a so-called "ONO" structure that includes silicon dioxide, silicon nitride, and silicon dioxide.

The channel of the cell films 165 may be formed of and include a semiconductive material, a non-silicon channel material, or other channel material. The material of the channel may include, but is not limited to, a polysilicon material (e.g., polycrystalline silicon), a III-V compound semiconductive material, a II-VI compound semiconductive material, an organic semiconductive material, GaAs, InP, GaP, GaN, an oxide semiconductive material, or a combination thereof. In some embodiments, the channel is polysilicon, such as a doped polysilicon. The channel may be configured as a so-called doped hollow channel (DHC) or other configuration. The first fill structure 162 may be a dielectric material, such as silicon dioxide.

Figure 9:
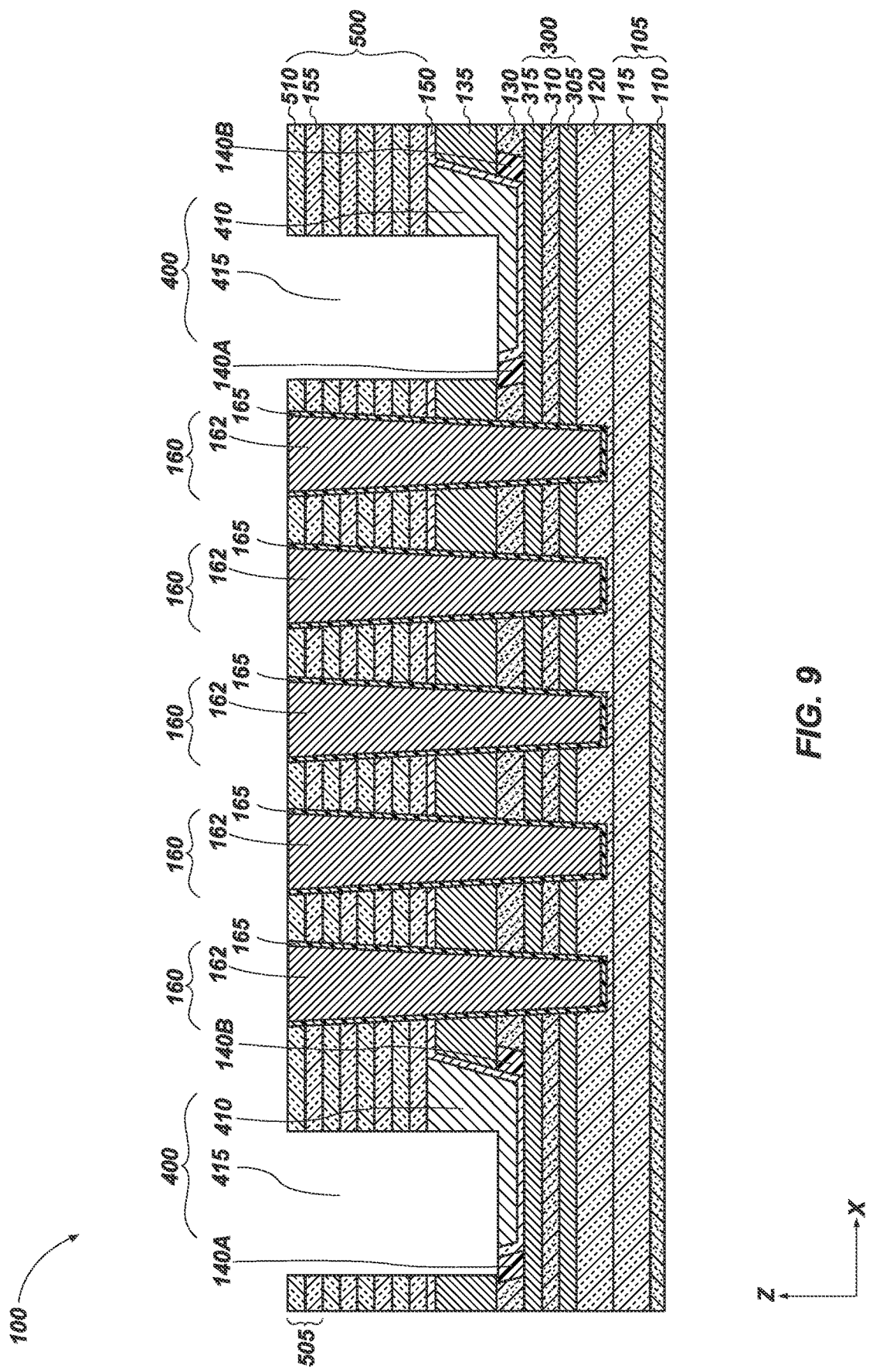
Figure 10:
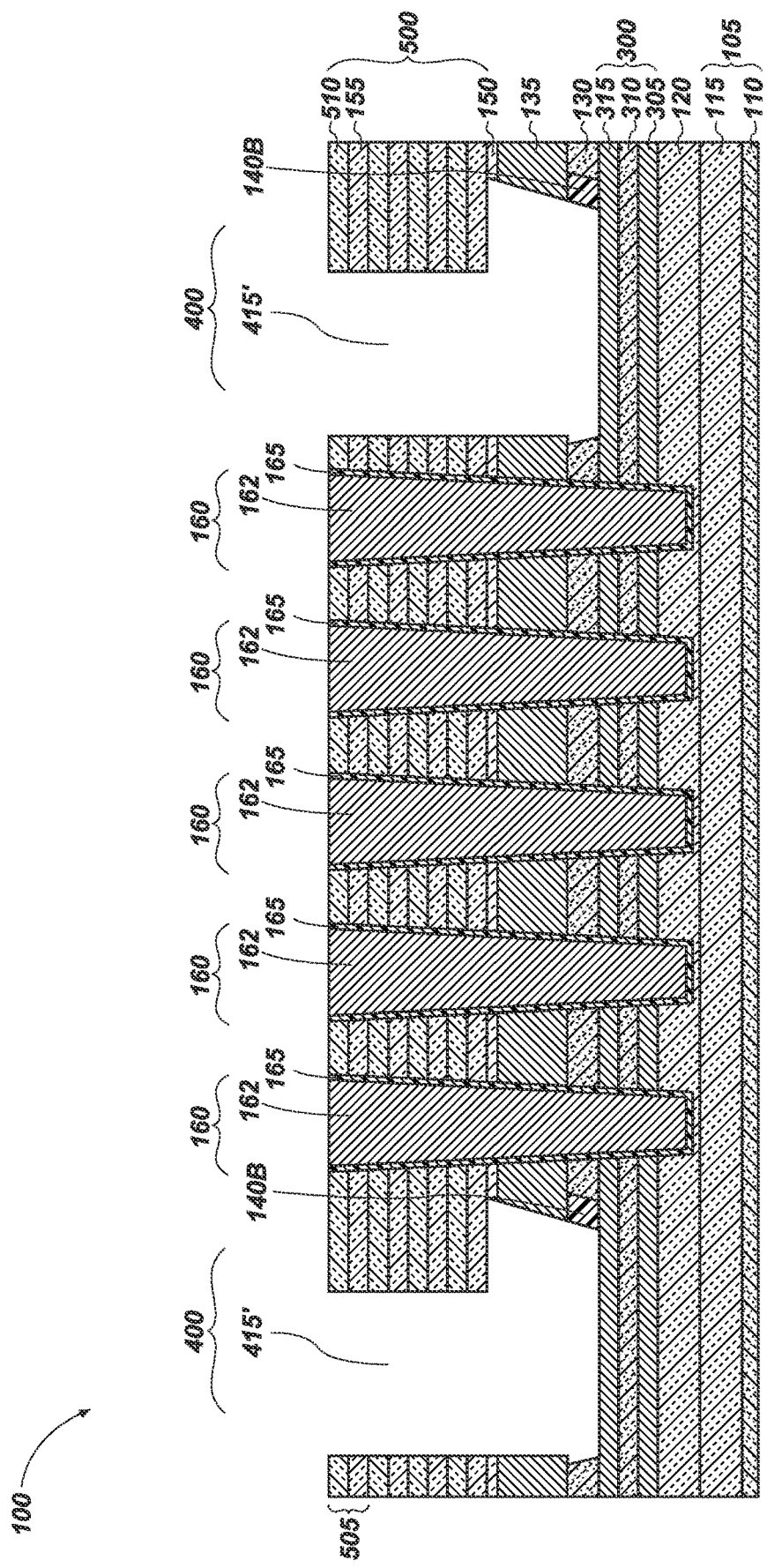

Referring to FIGS. 9 and 10, a portion of the tiers 505, a portion of the insulative cap material 135, and at least a portion of the etch stop material 410 may be removed to form a slit opening 415, 415' that exposes the source contact sacrificial structure 300. As discussed in more detail below, a replacement gate process used to remove the alternating insulating structures 510 and replace the alternating insulating structures 510 with conductive structures 180 may be conducted through the slit opening 415, 415'. A center line of the slit opening 415, 415' may be laterally offset from a center line of the slit sacrificial structure 400, as shown in FIG. 9. However, in other embodiments, the center line of the slit opening 415 may be aligned with the center line of the slit sacrificial structure 400 (see FIG. 19). The portion of the tiers 505, the portion of the insulative cap material 135, a portion of the second liner material 150, and the portion of the etch stop material 410 is removed, as shown in FIG. 9, to form the slit opening 415 that extends through the tiers 505, the insulative cap material 135, and the doped semiconductive material 130. The tiers 505, the insulative cap material 135, the doped semiconductive material 130, the second liner material 150, and the portion of the etch stop material 410 may be removed by one or more etch processes. If a single etch process is conducted, the tiers 505, the insulative cap material 135, the doped semiconductive material 130, the second liner material 150, and the etch stop material 410 may be substantially removed by the single etch process. If more than one etch process is conducted, one or more materials of the tiers 505, the insulative cap material 135, the doped semiconductive material 130, the second liner material 150, and the etch stop material 410 may be removed or partially removed during the first etch process to form the slit opening 415 and a second etch process may be conducted to remove additional portions of the etch stop material 410 to form the slit opening 415'.

The slit sacrificial structure 400 may function as an etch stop during the etch process to form the slit opening 415, 415'. A portion of the etch stop material 410 and second liner material 150 may remain adjacent to the slit opening 415. The tiers 505, the insulative cap material 135, and the blocking region 140 may etch at a faster rate than the material of the slit sacrificial structure 400. With the slit opening 415 offset from the slit sacrificial structure 400, the portion of the etch stop material 410 remaining in the slit opening 415 may exhibit a stepped or otherwise irregular profile. The first blocking region 140A and the second blocking region 140B may also remain, protecting the doped semiconductive material 130 from being removed (e.g., exhumed) during the removal of the surrounding materials. As shown in FIG. 9, the first blocking region 140A and the second blocking region 140B are present adjacent to the slit opening 415, which is offset from the center line of the slit sacrificial structure 400. The first blocking region 140A and second blocking region 140B may provide mechanical strength to the doped semiconductive material 130.

As shown in FIG. 10, the etch stop material 410, the neighboring second liner material 150, and at least a portion of the first blocking region 140A may be removed (e.g., exhumed) to form the slit opening 415' through the insulative cap material 135 and to expose the third sacrificial structure 315 of the source contact sacrificial structure 300. The etch stop material 410, the neighboring second liner material 150, and the first blocking region 140A may be substantially completely removed, with a portion of the third sacrificial structure 315, optionally, remaining adjacent to the second sacrificial structure 310. While FIGS. 9 and 10 illustrate the slit opening 415, 415' as extending through the tiers 505 and the doped semiconductive material 130 to an upper surface of the third sacrificial structure 315, the slit opening 415' may extend partially into the third sacrificial structure 315. As shown in FIG. 10, only the second blocking region 140B remains adjacent to the doped semiconductive material 130. Therefore, the doped semiconductive material 130 proximal to the second blocking region 140B remains protected. For convenience, the slit opening 415 and the slit opening 415' may be collectively referred to hereinafter as the slit opening 415.

If the center line of the slit opening 415 is offset from the center line of the slit sacrificial structure 400, as shown in FIGS. 9 and 10, the first blocking region 140A may substantially be removed during the formation of the slit opening 415. In other words, while the first blocking region 140A and the second blocking region 140B are present after forming the slit opening 415, only the second blocking region 140B is present after forming the slit opening 415'. The second blocking region 140B may function as a cap of the doped semiconductive material 130, protecting the doped semiconductive material 130 from subsequently conducted removal processes. Therefore, one or both of the first blocking region 140A and the second blocking region 140B may protect the doped semiconductive material 130 from being removed (e.g., exhumed) at different stages during the formation of the slit opening 415, 415'.

Figure 11:
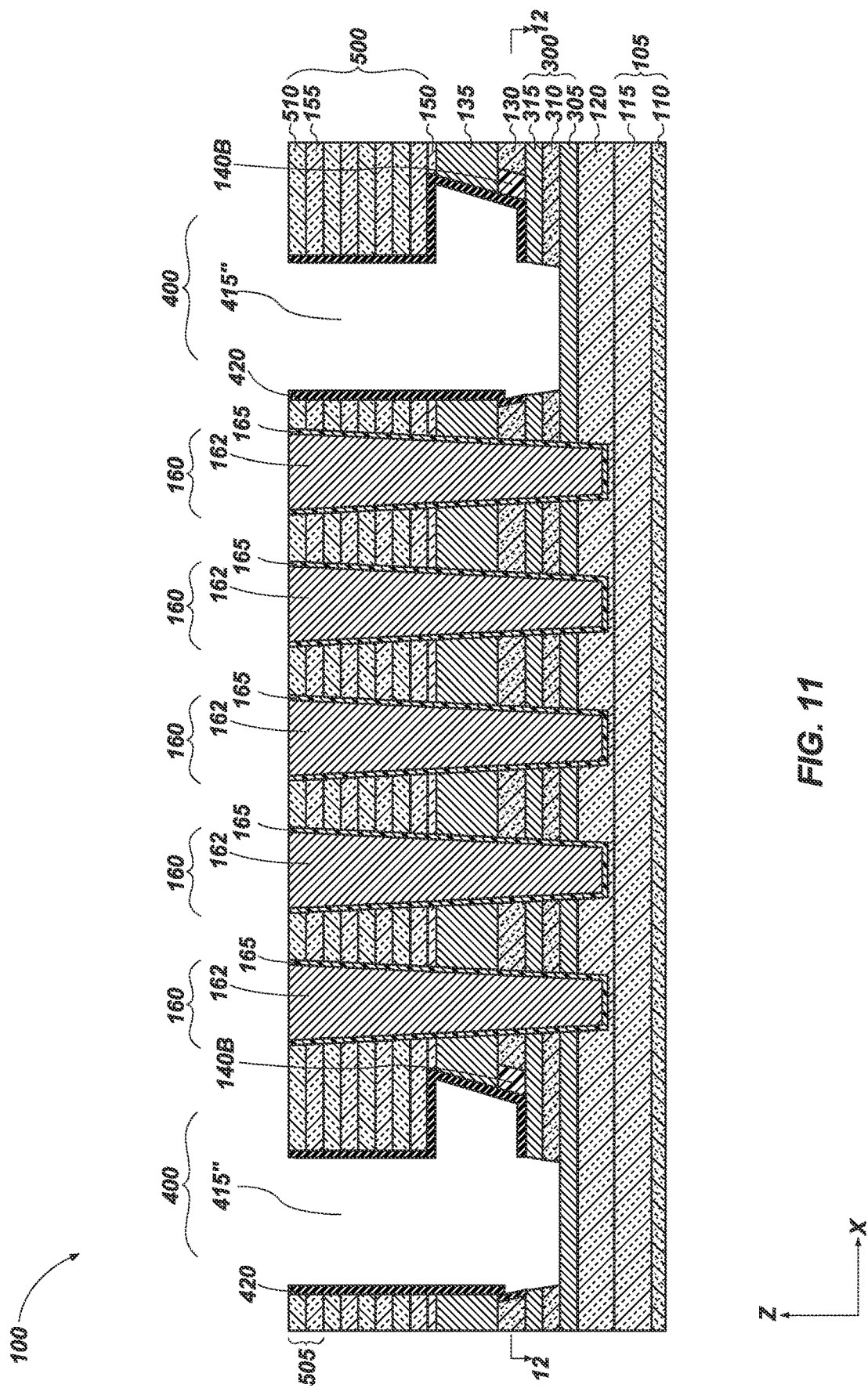

As shown in FIG. 11, a sacrificial slit liner 420 may be formed on exposed surfaces of the tiers 505, the insulative cap material 135, the second blocking region 140B, and the third sacrificial structure 315 within the slit opening 415'. The sacrificial slit liner 420 may be conformally formed by conventional techniques such that a portion of the slit opening 415' remains open (e.g., unoccupied). The sacrificial slit liner 420 may be formed of and include a dielectric material, a semiconductive material, or a conductive material. In some embodiments, the sacrificial slit liner 420 is undoped polysilicon.

Instead of forming the first blocking region 140A and second blocking region 140B as described above in FIGS. 1-3, the first blocking region 140A and second blocking region 140B may be formed at the process stage shown in FIGS. 9 and 10. Rather than converting the doped semiconductive material 130 at the process stage shown in FIG. 3, sidewalls of the doped semiconductive material 130 may define the recess 405. After forming the slit sacrificial structure 400, tier stack 500, pillars 160, and a portion of the sacrificial slit liner 420, exposed portions of the doped semiconductive material 130 may be converted to the first blocking region 140A and the second blocking region 140B during or following the formation of the slit opening 415, 415'. The doped semiconductive material 130 may be exposed by removing portions of the second liner material 150 and etch stop material 410 adjacent to the doped semiconductive material 130. The first blocking regions 140A and second blocking regions 140B may then be formed from the doped semiconductive material 130 as previously described.

A portion of the sacrificial slit liner 420 may be removed from a bottom surface of the slit opening 415', exposing the third sacrificial structure 315 of the source contact sacrificial structure 300. The third sacrificial structure 315 may be removed to expose the second sacrificial structure 310 of the source contact sacrificial structure 300. The sacrificial slit liner 420 and the third sacrificial structure 315 at the bottom of the slit opening 415 may be removed by conventional techniques (e.g., by a punch etch process). A portion of the exposed second sacrificial structure 310 may also be removed during the process of removing the sacrificial slit liner 420 and the third sacrificial structure 315, forming the slit opening 415".

Figure 13:
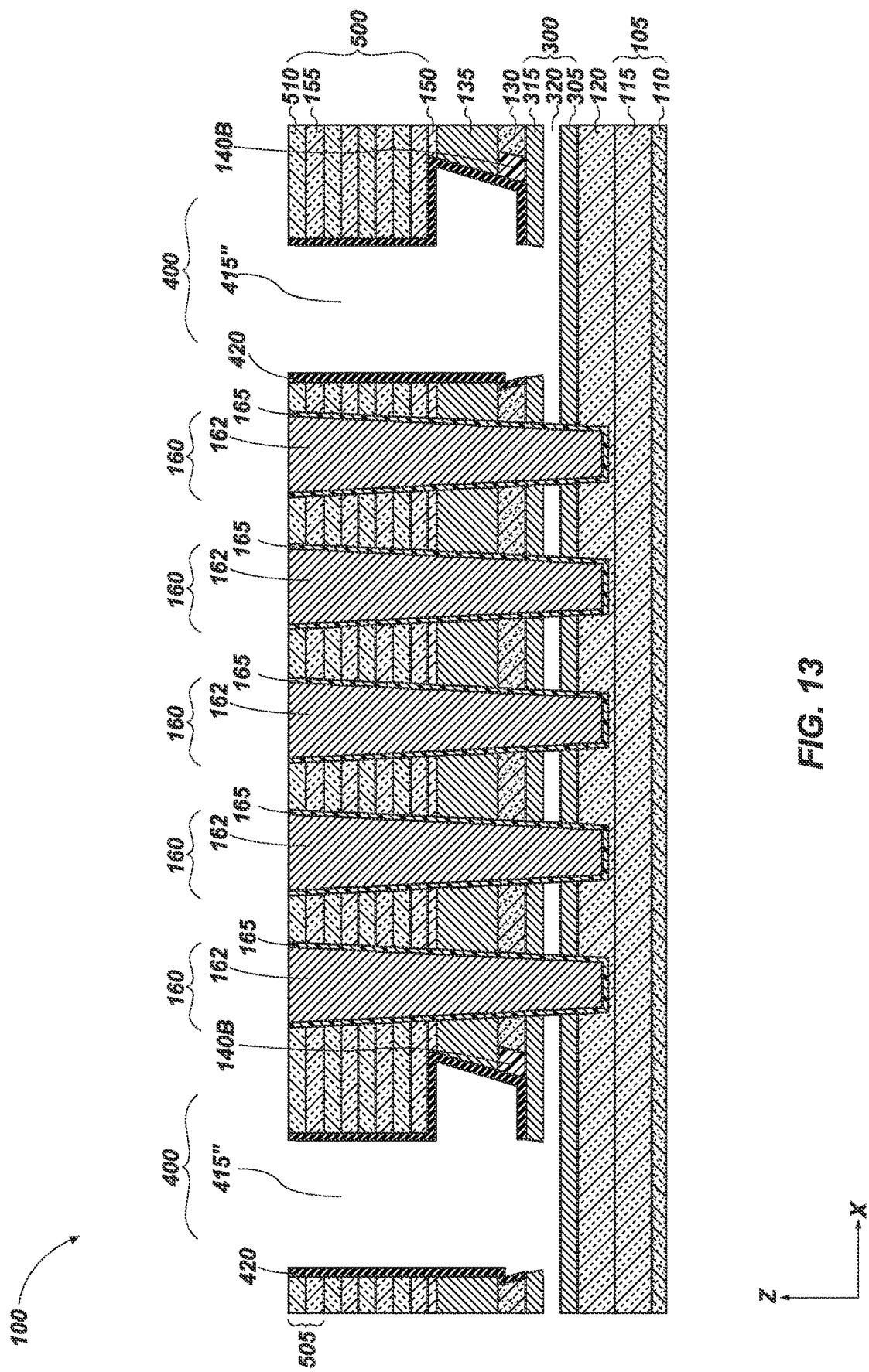

To provide access to the pillars 160, the source contact sacrificial structure 300 and portions of the cell films 165 (charge blocking material, charge trap material, and tunnel dielectric material) are sequentially removed, as shown in FIGS. 13 and 14. The source contact sacrificial structure 300 is substantially completely removed while a majority of the doped semiconductive material 130 remains intact (e.g., unetched) by selecting the etch conditions used to remove the source contact sacrificial structure 300. In other words, the doped semiconductive material 130 is substantially resistant to the etch conditions used to remove the source contact sacrificial structure 300. The second sacrificial structure 310 may initially be removed through the slit opening 415', as shown in FIG. 13, and a source contact opening 320 is formed. As described below, the size of the source contact opening 320 is sequentially increased (e.g., enlarged) to provide lateral access to the pillars 160 following the removal of the source contact sacrificial structure 300.

The second sacrificial structure 310 of the source contact sacrificial structure 300 is selectively removed without substantially removing the first and third sacrificial structures 305, 315 or the cell films 165. The second sacrificial structure 310 may be selectively etched by conventional techniques, such as by conventional etch conditions, which are selected depending on the chemical composition of the second sacrificial structure 310 relative to the chemical composition of other exposed materials. By way of example only, if the first sacrificial structure 305, the third sacrificial structure 315, and the charge blocking material of the cell films 165 are silicon oxide materials and the second sacrificial structure 310 is a silicon nitride material, an etch chemistry formulated to remove silicon nitride may be used, such as a phosphoric acid-based etch chemistry. The doped semiconductive material 130 is not exposed to (e.g., is protected from) the etch conditions by the sacrificial slit liner 420, the tiers 505, and the third sacrificial structure 315.

As shown in FIG. 14, the first sacrificial structure 305, the third sacrificial structure 315, and portions of the cell films 165 are removed to form the source contact opening 320'. Removing the first sacrificial structure 305, the third sacrificial structure 315, and the portions of the cell films 165 increases the size of the source contact opening 320, forming the source contact opening 320'. The source contact opening 320' may provide access (e.g., lateral access) to the pillars 160 following the substantially complete removal of the source contact sacrificial structure 300. Portions of the charge blocking material, the charge trap material, and the tunnel dielectric material may be removed by conventional techniques to expose the channel of the cell films 165 laterally adjacent to the source contact opening 320' and the pillars 160. An exposed portion of the first sacrificial structure 305, the third sacrificial structure 315, and outermost materials of the cell films 165 are selectively removed from within the source contact opening 320', without substantially removing the sacrificial slit liner 420. The outermost materials of the cell films 165 may include the charge blocking material, the charge trap material, and the tunnel dielectric material, exposing the channel of the cell films 165. For simplicity and convenience in FIGS. 14, 15, 17, and 19-26, cell films 165' is used to indicate that the channel of the cell films 165 remains laterally adjacent to the source contact opening 320', with the charge blocking material, the charge trap material, the tunnel dielectric material, and the channel present in other portions of the pillars 160. The channel of the cell films 165' extends continuously from the tiers 505 and into the semiconductive material 120. The charge blocking material, the charge trap material, and the tunnel dielectric material of the cell films 165, the first sacrificial structure 305, and the third sacrificial structure 315 may be selectively etched by conventional techniques, which are determined depending on the chemical composition of the cell films 165, the first sacrificial structure 305, and the third sacrificial structure 315 relative to the chemical composition of other exposed materials. By selecting the etch conditions, the cell films 165 adjacent to the source contact opening 320, the first sacrificial structure 305, and the third sacrificial structure 315 are selectively removed. The first sacrificial structure 305 and third sacrificial structure 315 may be substantially completely removed while the exposed portion of the cell films 165 adjacent (e.g., laterally adjacent) to the source contact opening 320' is partially removed.

In some embodiments, the doped semiconductive material 130 is polysilicon and is selectively etchable relative to silicon dioxide of the source contact sacrificial structure 300 and silicon dioxide of the pillars 160. By way of example only, if the first sacrificial structure 305, the third sacrificial structure 315, and the cell films 165 are silicon oxide materials, an etch chemistry formulated to selectively remove silicon oxide materials may be used, such as an HF-based etch chemistry. Forming the source contact opening 320' exposes a top surface of the semiconductive material 120 and a top surface of the first blocking region 140A and second blocking region 140B. Forming the source contact opening 320' also exposes a bottom horizontal surface of the doped semiconductive material 130 and exposes the channel of the cell films 165'. The bottom surface of the doped semiconductive material 130 may be substantially coplanar with a bottom surface of the sacrificial slit liner 420, while a bottom horizontal surface of the cell films 165' may be recessed relative to (e.g., not coplanar with) the bottom surfaces of the doped semiconductive material 130 and the sacrificial slit liner 420.

A source contact opening liner (not shown) may be formed within the source contact opening 320'. The source contact opening liner may be formed along the top surfaces of the semiconductive material 120 and the first blocking region 140A and second blocking region 140B, along the bottom surfaces of the doped semiconductive material 130 and the sacrificial slit liner 420, and along the exposed portions of the materials of the pillar 160. By way of example only, the source contact opening liner may be a dielectric material, such as a silicon oxide material or a silicon nitride material, that exhibits etch selectivity relative to other exposed materials. In some embodiments, the source contact opening liner is a highly conformal silicon dioxide.

While the first sacrificial structure 305, the second sacrificial structure 310, and the third sacrificial structure 315 have been removed (e.g., are not present) in the perspective of FIG. 14, these materials of the source contact sacrificial structure 300 may be present in other portions (not shown) of the electronic device structure 100, such as in portions of the electronic device structure 100 distal to the slit opening 415". The source contact sacrificial structure 300 may be present (e.g., visible), for example, in peripheral regions of the electronic device structure 100. In other words, the source contact sacrificial structure 300 may be positioned between the semiconductive material 120 and the doped semiconductive material 130 in the other portions of the electronic device structure 100.

Figure 16:
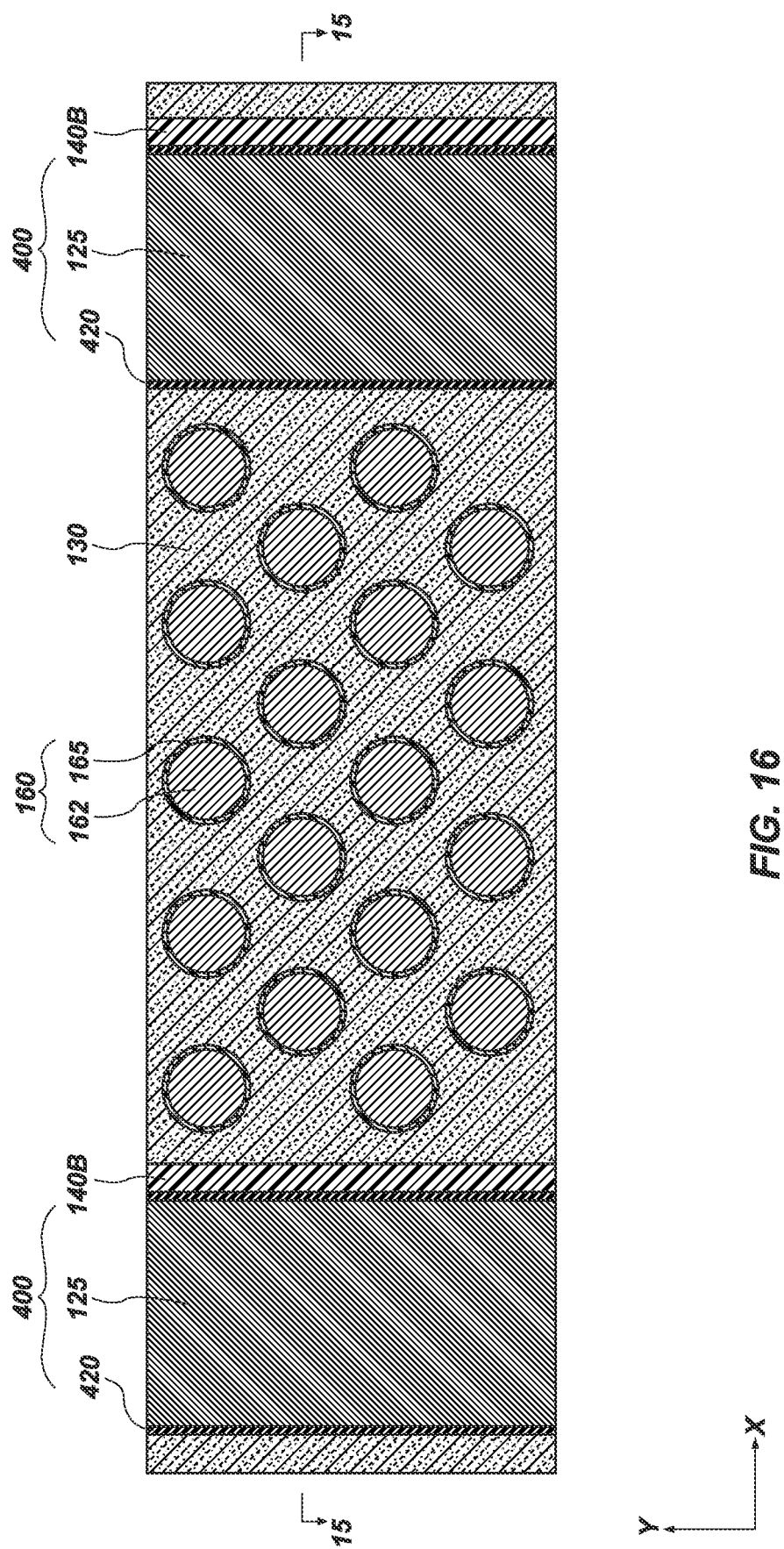

As shown in FIGS. 15 and 16, a source contact 125 is formed within the source contact opening 320'. The source contact 125 may be conformally formed in the source contact opening 320', substantially completely filling the source contact opening 320' and filling at least a portion of the slit opening 415". In some embodiments, the source contact 125 is formed of polysilicon, such as $N^+$ doped polysilicon. The source contact 125 may be formed at a thickness of from about 500 Å to about 2000 Å, such as from about 700 Å to about 1500 Å, from about 700 Å to about 1800 Å, from about 800 Å to about 1500 Å, from about 800 Å to about 1800 Å, or from about 800 Å to about 1800 Å. The source contact 125 extends in a horizontal direction (e.g., laterally) between the doped semiconductive material 130 and the semiconductive material 120 and contacts the pillars 160. An oxidation act may, optionally, be conducted to activate dopants in the source contact 125 and so that the source contact 125 is substantially continuous and includes few holes, voids, or a seam. Although the source contact 125 is present between the doped semiconductive material 130 and the source stack 105 in the perspectives shown in FIGS. 15-18, the peripheral regions of the electronic device structure 100 may include the source contact sacrificial structure 300 between the doped semiconductive material 130 and the source stack 105.

A portion of the source contact 125 may be removed from sidewalls of the sacrificial slit liner 420. The portion of the source contact 125 may be removed by conventional techniques. The source contact 125 is substantially removed from the slit opening 415' while the source contact 125 remains in the source contact opening 320'. Removing the source contact 125 from the slit opening 415' exposes a horizontally oriented portion of the source contact 125 in a location corresponding to the previous location of the slit sacrificial structure 400. The remaining source contact 125 extends between the doped semiconductive material 130 and the semiconductive material 120 and contacts (e.g., directly contacts) the pillars 160. The source contact 125 directly contacts a lower surface of the doped semiconductive material 130 and an upper surface of the semiconductive material 120 and of the second blocking region 140B. The source contact 125 also directly contacts upper and lower horizontal surfaces of the cell films 165' and the channel material of the cell films 165'. The source contact 125 is separated from the tiers 505 by the doped semiconductive material 130 and the insulative cap material 135. While the source contact 125 is depicted as substantially completely filling the source contact opening 320', additional material of the source contact 125 may be removed while yet maintaining the source contact 125 in the source contact opening 320' as a substantially continuous material. For instance, the source contact 125 may be recessed below the previous location of the slit sacrificial structure 400.

Figure 17:
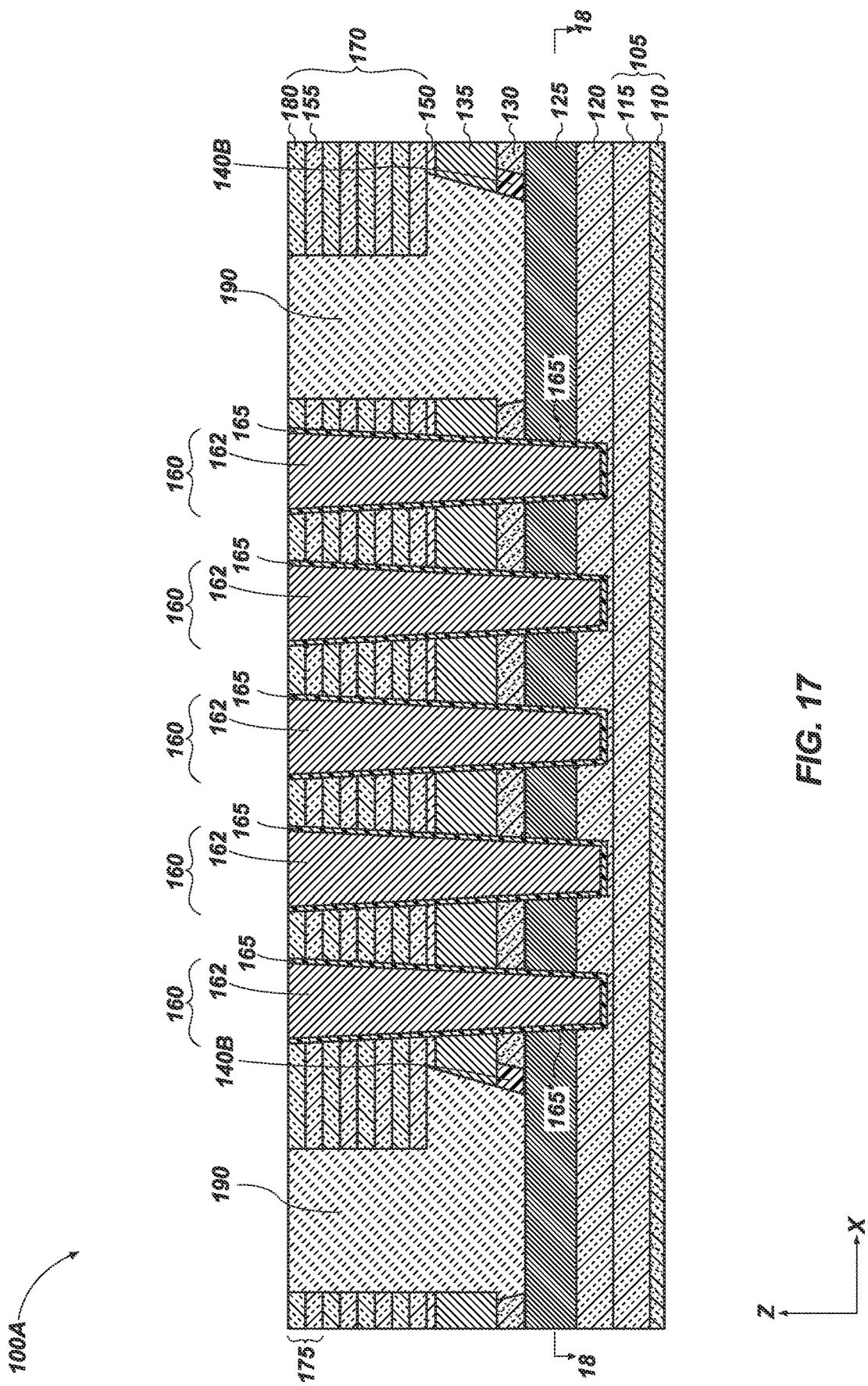
FIG. 17 is a cross-sectional, elevational, schematic illustration of an electronic device in accordance with embodiments of the disclosure formed by the process of FIGS. 1-16.
Figure 18:
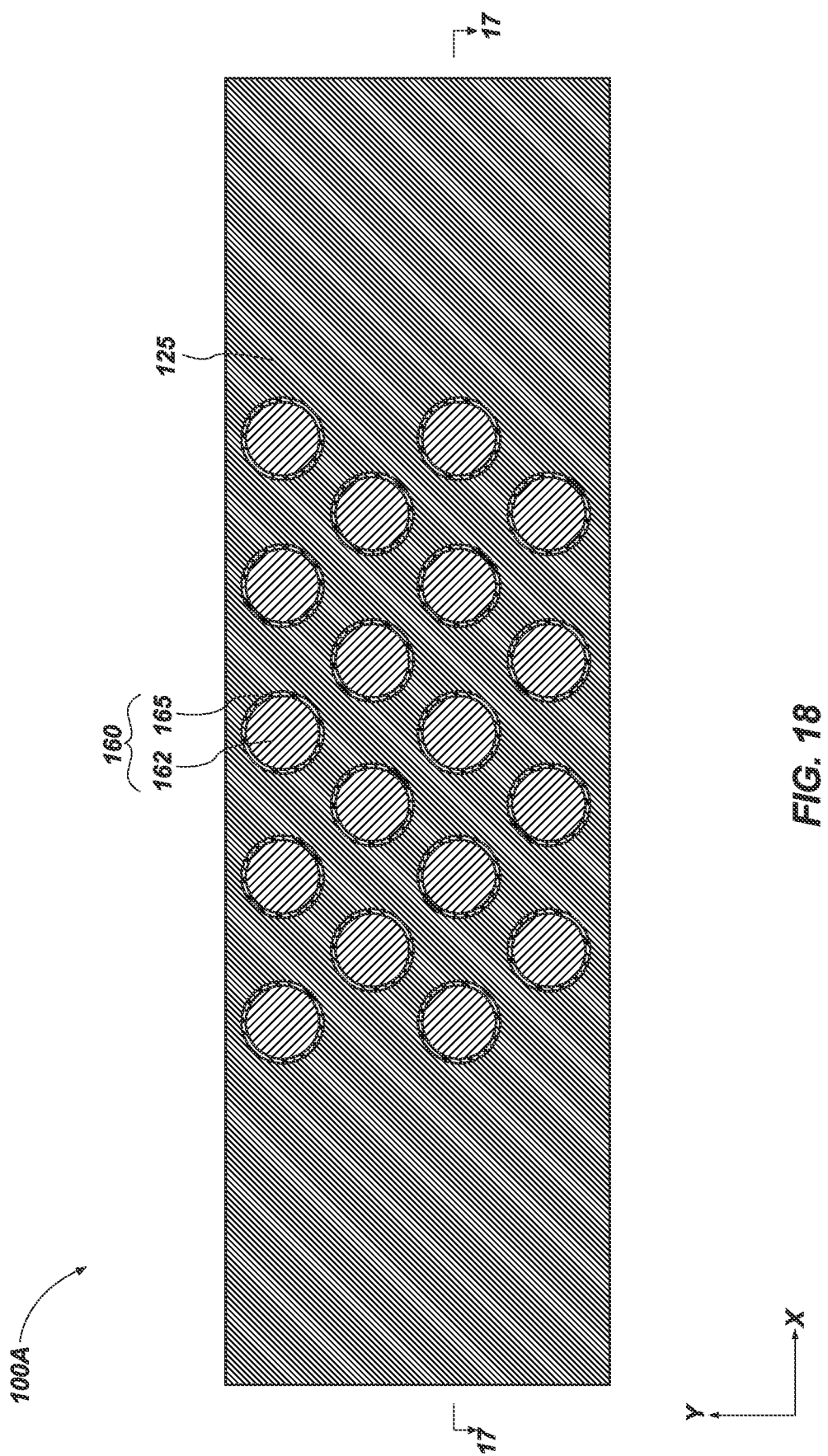
FIG. 18 is a simplified partial top-down view of the electronic device of FIG. 17.

Subsequent process acts are then conducted by conventional techniques to form an electronic device 100A from the electronic device structure 100 as shown in FIGS. 17 and 18. FIG. 17 is a partial cross-sectional schematic illustration taken through the line 17-17 in FIG. 18, and FIG. 18 is a partial cross-sectional top-down schematic illustration taken through the line 18-18 in FIG. 17. Referring to FIGS. 17 and 18, the sacrificial slit liner 420 may be substantially removed from the sidewalls of the doped semiconductive material 130, the insulative cap material 135, and the tiers 505. The exposed portion of the source contact 125 may, optionally, be oxidized by conventional techniques to form an oxidized portion (not shown) that is recessed in the source contact 125. The oxidized portion, if present, may extend continuously along an upper surface of the source contact 125.

A replacement gate process is conducted to remove the alternating insulating structures 510 of the tiers 505 and to form the conductive structures 180 of tiers 175. The alternating insulating structures 510 may be removed by exposing the tiers 505 to a wet etch chemistry formulated to remove, for example, silicon nitride of the tiers 505. The wet etchant may include, but is not limited to, one or more of phosphoric acid, sulfuric acid, hydrochloric acid, nitric acid, or a combination thereof. In some embodiments, the alternating insulating structures 510 of the tiers 505 are removed using a so-called "wet nitride strip" that includes phosphoric acid. A conductive material is formed in the resulting openings between the insulating structures 510 to form the conductive structures 180. While FIGS. 1-18 illustrate the formation of the electronic device 100A by the replacement gate process, the electronic device 100A according to embodiments of the disclosure may also be formed by a floating gate process.

A second fill structure 190 may be formed in the remaining volume of the slit opening 415'. The second fill structure 190 may comprise one or more materials such as a single dielectric material, a combination of a dielectric material and silicon, or a combination of a dielectric material and a conductive material. The electronic device 100A includes the source stack 105, the source contact 125 adjacent to (e.g., vertically adjacent to, on) the source stack 105, and the second blocking region 140B adjacent to (e.g., vertically adjacent to, on) the source contact 125. The doped semiconductive material 130 is adjacent to (e.g., vertically adjacent to, on) the source contact 125 and adjacent to (e.g., laterally adjacent to) the second blocking region 140B. The second blocking region 140B may laterally extend proximal to the second fill structure 190, with the second blocking region 140B separated from an adjacent pillar 160 by a portion of the doped semiconductive material 130. In other words, at least some of the doped semiconductive material 130 may remain between the pillar 160 and the second blocking region 140B. Therefore, the second blocking region 140B does not directly contact the pillar 160 laterally adjacent to the doped semiconductive material 130.

The tiers 175 of alternating insulating structures 155 and conductive structures 180 are adjacent to (e.g., vertically adjacent to, on) the doped semiconductive material 130. Some of the conductive structures 180 are configured as so-called "replacement gate" word lines (e.g., word lines formed by a so-called "replacement gate" or "gate late" process). Other conductive structures 180, such as one or more of the lowermost conductive structures 180, are configured as select gate sources (SGSs) (not shown) and one or more of the uppermost conductive structures 180 are configured as select gate drains (SGDs) (not shown).

The thickness of the doped semiconductive material 130 may be selected depending on a desired distance between the source contact 125 and the SGS of the tier structures 170. The thickness of the doped semiconductive material 130 may be sufficient to separate (e.g., physically separate) the source contact 125 from the SGS by a desired distance. The distance separating the source contact 125 from the SGS of the tiers 175, corresponds to the thickness of the doped semiconductive material 130 and the adjacent insulating structures 155 of the tiers 175. In some embodiments, the thickness of the doped semiconductive material 130 is about 500 Å.

The pillars 160 (e.g., memory pillars) extend through the tiers 175, the doped semiconductive material 130, the source contact 125, and at least partially into the semiconductive material 120. The pillars 160 may include the first fill structure 162 and the cell films 165 concentrically surrounding the first fill structure 162. The cell films 165 function as tunneling structures of the pillars 160 of the electronic device 100A. In locations of the pillars 160 laterally adjacent to the source contact 125, the channel of the cell films 165 remains on sidewalls of the first fill structure 162.

The electronic device 100A includes the second blocking region 140B between the doped semiconductive material 130 and the second fill structure 190 in the lateral direction, and between the insulative cap material 135 and the source contact 125 in the vertical direction. The source contact 125 directly contacts a lower surface of the doped semiconductive material 130, a lower surface of the second fill structure 190, a lower surface of the second blocking region 140B, and an upper surface of the semiconductive material 120.

Forming the blocking region 140 (e.g., the second blocking region 140B) to protect (e.g., cap) the doped semiconductive material 130 provides advantages over conventional methods of forming electronic device structures. By capping the doped semiconductive material 130 with the blocking region 140 (e.g., the first blocking region 140A and the second blocking region 140B), the doped semiconductive material 130, the source stack 105, and the pillars 160 are protected while the slit sacrificial structures 400 are removed during the formation of the slit opening 415, 415', 415". The second blocking region 140B also enables access to the source contact sacrificial structure 300 through the slit opening 415, 415', 415" by protecting the doped semiconductive material 130 during removal of the source contact sacrificial structure 300 (e.g., the first, second, and third sacrificial structures 305, 310, 315) at a later stage of the fabrication process. Removing the source contact sacrificial structure 300 may be achieved without removing portions of the doped semiconductive material 130, which are protected by the second blocking region 140B. The likelihood of undesirably removing portions of the doped semiconductive material 130 is, therefore, reduced or eliminated. As shown in FIGS. 1-18, the first blocking region 140A and the second blocking region 140B may protect the doped semiconductive material 130 even in situations where the slit opening 415 is not aligned with (e.g., centered over) the slit sacrificial structures 400. For instance, if the slit opening 415 is not centered over the slit sacrificial structures 400, the blocking region 140 (e.g., the first blocking region 140A and the second blocking region 140B) on either side of the slit sacrificial structure 400 protects the doped semiconductive material 130 from being removed. The second blocking region 140B also provides a margin of error in forming the slit opening 415, 415', 415".

The electronic device structure 100 according to embodiments of the disclosure provides advantages over conventional electronic device structures that lack a blocking region laterally adjacent to the doped semiconductive material 130. By protecting the doped semiconductive material 130 with the second blocking region 140B, integrity of the electronic device structure 100 is improved. The electronic device structure 100 including the second blocking region 140B also has improved performance, reliability, and durability as conventional electronic device structures. Furthermore, the electronic device structure described herein provide one or more of improved performance, reliability, durability, and lower costs as compared to conventional structures, conventional devices, and conventional systems that lack the blocking region.

Additional embodiments of the disclosure are shown in FIGS. 19 through 26, which illustrate the formation of electronic device 100'A from electronic device structure 100'. The elements and materials of electronic device 100' are substantially the same as those of electronic device structure 100', electronic device 100'A described above for FIGS. 1-18, except that the slit opening 415 is aligned with (e.g., centered over) the slit sacrificial structures 400 and both the first blocking region 140A and the second blocking region 140B are present in the electronic device 100A' (see FIG. 26). FIGS. 19 through 26 are simplified partial cross sectional and partial top-down perspective views illustrating processing stages of a method of forming the electronic device 100A' (e.g., a memory device, such as a 3D NAND Flash memory device) from the electronic device structure 100', in accordance with embodiments of the disclosure. Throughout the remaining description and accompanying figures, functionally similar features (e.g., structures, devices) are referred to with similar reference numerals. To avoid repetition, not all features and methodology shown in the remaining figures are described in detail herein. Rather, unless described otherwise below, a feature designated by a reference numeral of a previously described feature (whether the previously described feature is first described before the present paragraph, or is first described after the present paragraph) will be understood to be substantially similar to the previously described feature. Only those method acts that differ from the embodiments of the disclosure in FIGS. 1-18 are described in detail below.

Figure 19:
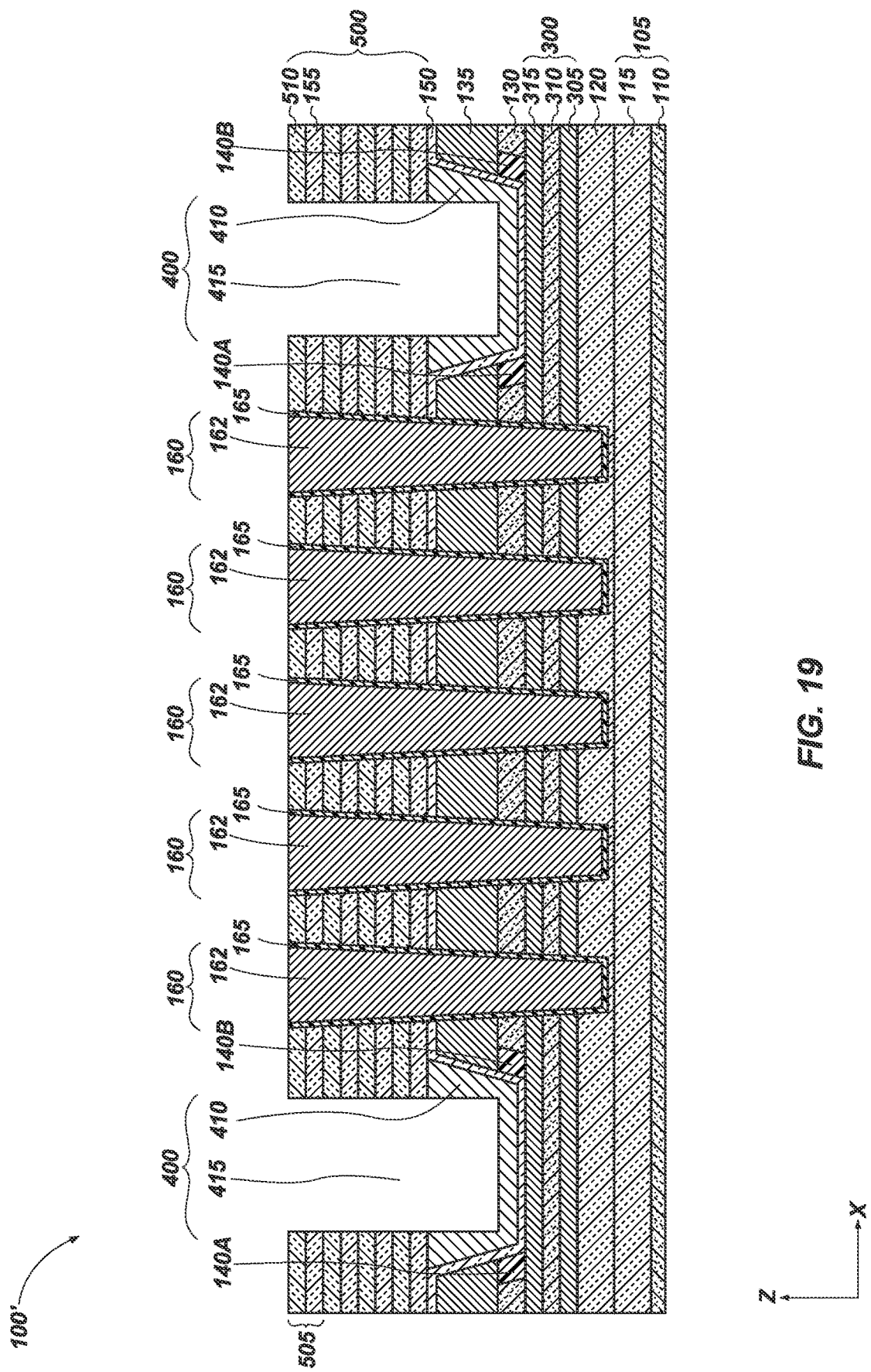
FIGS. 19-24 are partial cross-sectional views and FIG. 25 is a partial top-down view illustrating a method of forming electronic devices in accordance with other embodiments of the disclosure.

The electronic device structure 100' is formed as described in FIGS. 1-18 above. The slit opening 415 is then formed. As shown in FIG. 19, the slit opening 415 is laterally aligned in a horizontal direction (e.g., the X-direction) over (e.g., vertically adjacent to) the etch stop material 410. The center line of the slit opening 415 is, therefore, aligned with the center line of the slit sacrificial structure 400. The first blocking region 140A and the second blocking region 140B are separated from the slit opening 415 by the second liner material 150 and a portion of the etch stop material 410, with substantially equal amounts of the etch stop material 410 remaining at the bottom of the slit opening 415. In other words, the etch stop material 410, the second liner material 150, and the blocking region 140 are arranged substantially symmetric around the center line. By centering the slit opening 415, the first blocking region 140A and second blocking region 140B may be protected from removal during subsequent removal of the etch stop material 410 and the second liner material 150.

Figure 20:
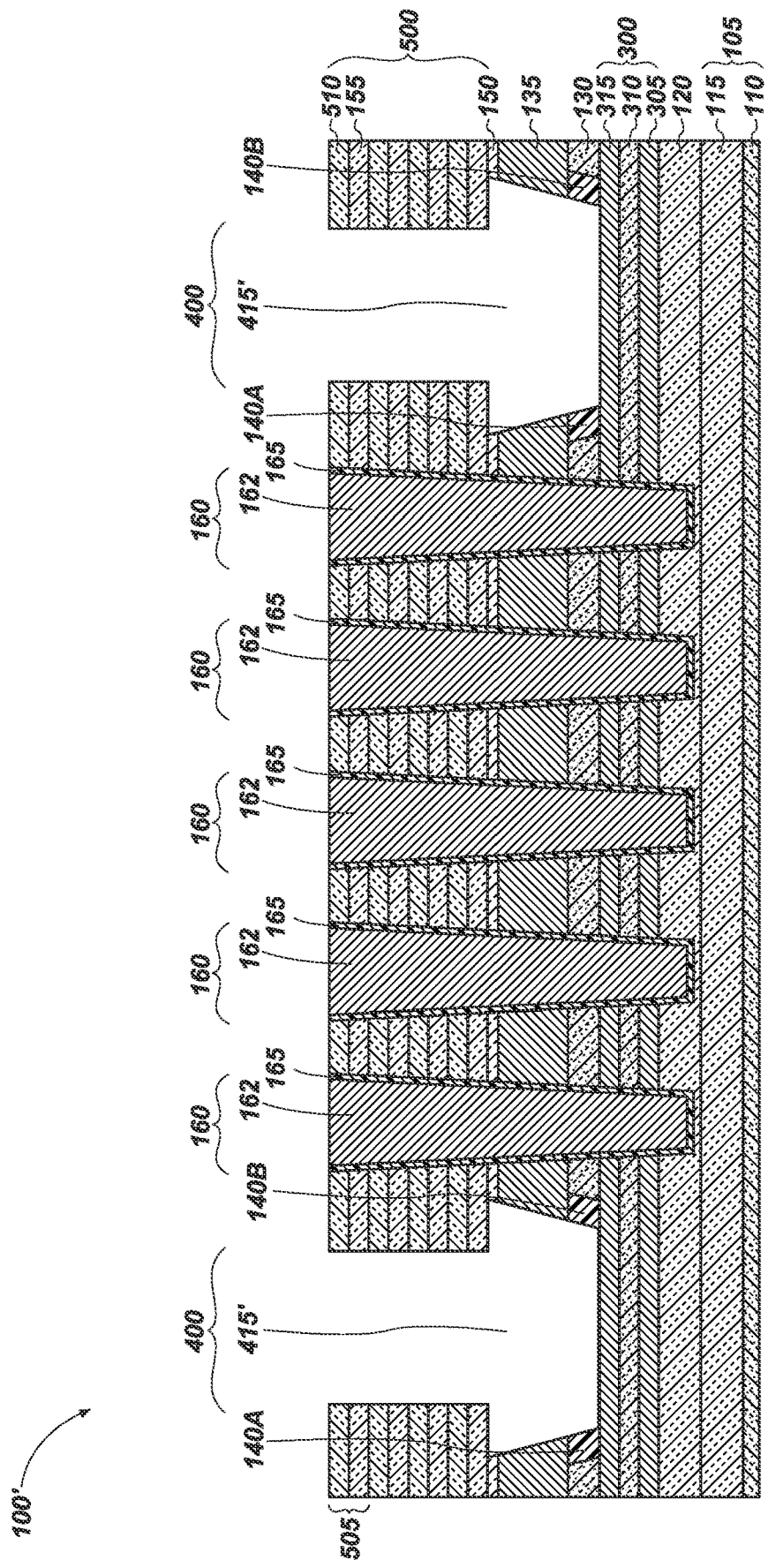

As shown in FIG. 20, the etch stop material 410 and the second liner material 150 are removed, increasing a volume of the slit opening 415 to slit opening 415'. However, at least a portion of each of the first blocking region 140A and second blocking region 140B may remain adjacent to a respective portion of the doped semiconductive material 130. The etch stop material 410 and second liner material 150 may be removed as described for FIGS. 9 and 10. The first blocking region 140A and the second blocking region 140B are laterally adjacent to (e.g., cap) sidewalls of the doped semiconductive material 130, protecting the doped semiconductive material 130 during the formation of the slit opening 415 and the slit opening 415'. The first blocking region 140A and second blocking region 140B may also provide mechanical strength within the electronic device structure 100'. Forming the slit opening 415, 415' exposes the source contact sacrificial structure 300, such as an upper surface of the third sacrificial structure 315, the first blocking region 140A, the second blocking region 140B, and the insulative cap material 135. The first blocking region 140A and second blocking region 140B also protect the doped semiconductive material 130 during later removal processes, such as removal of the source contact sacrificial structure 300.

Figure 12:
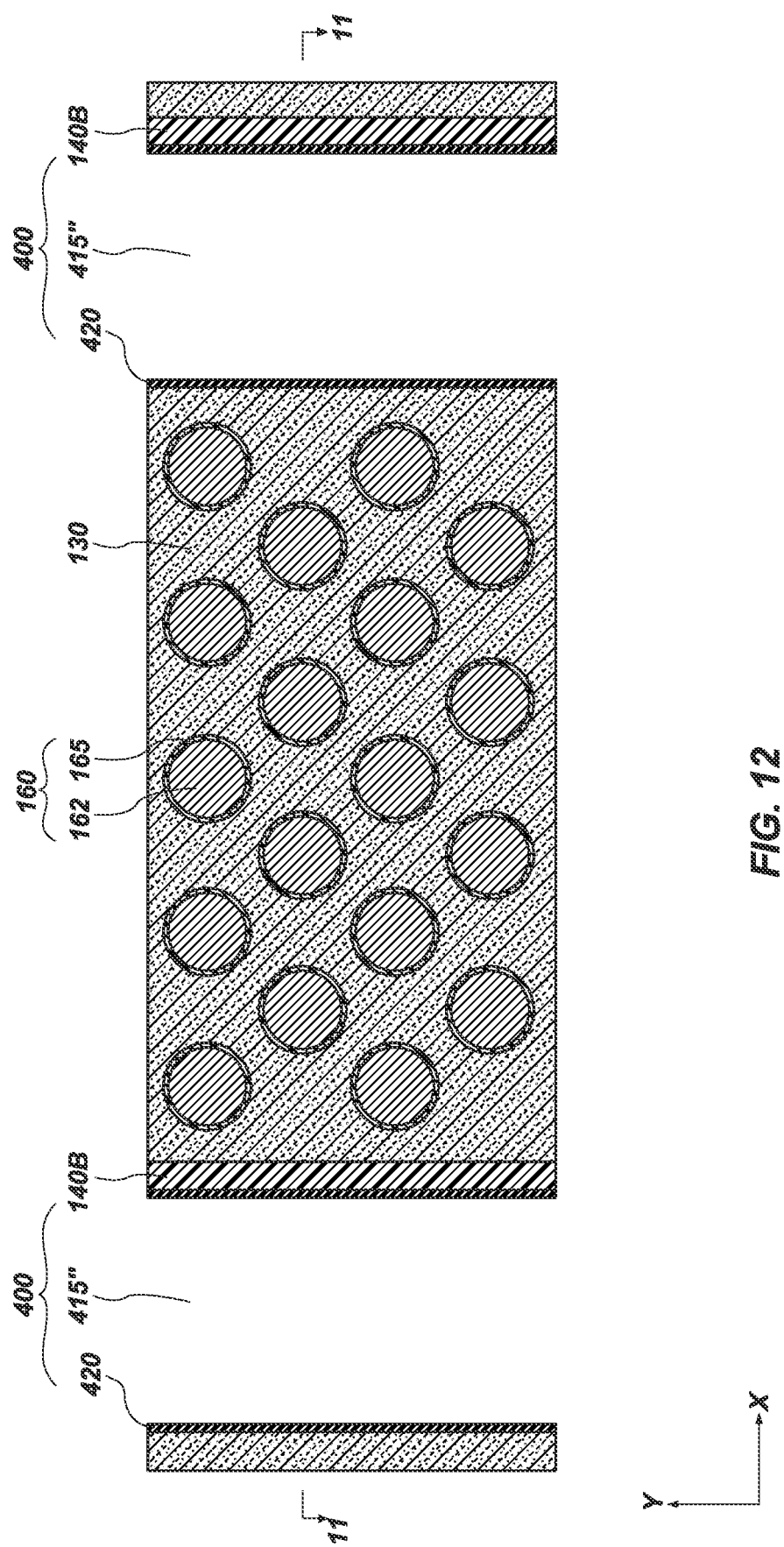
Figure 21:
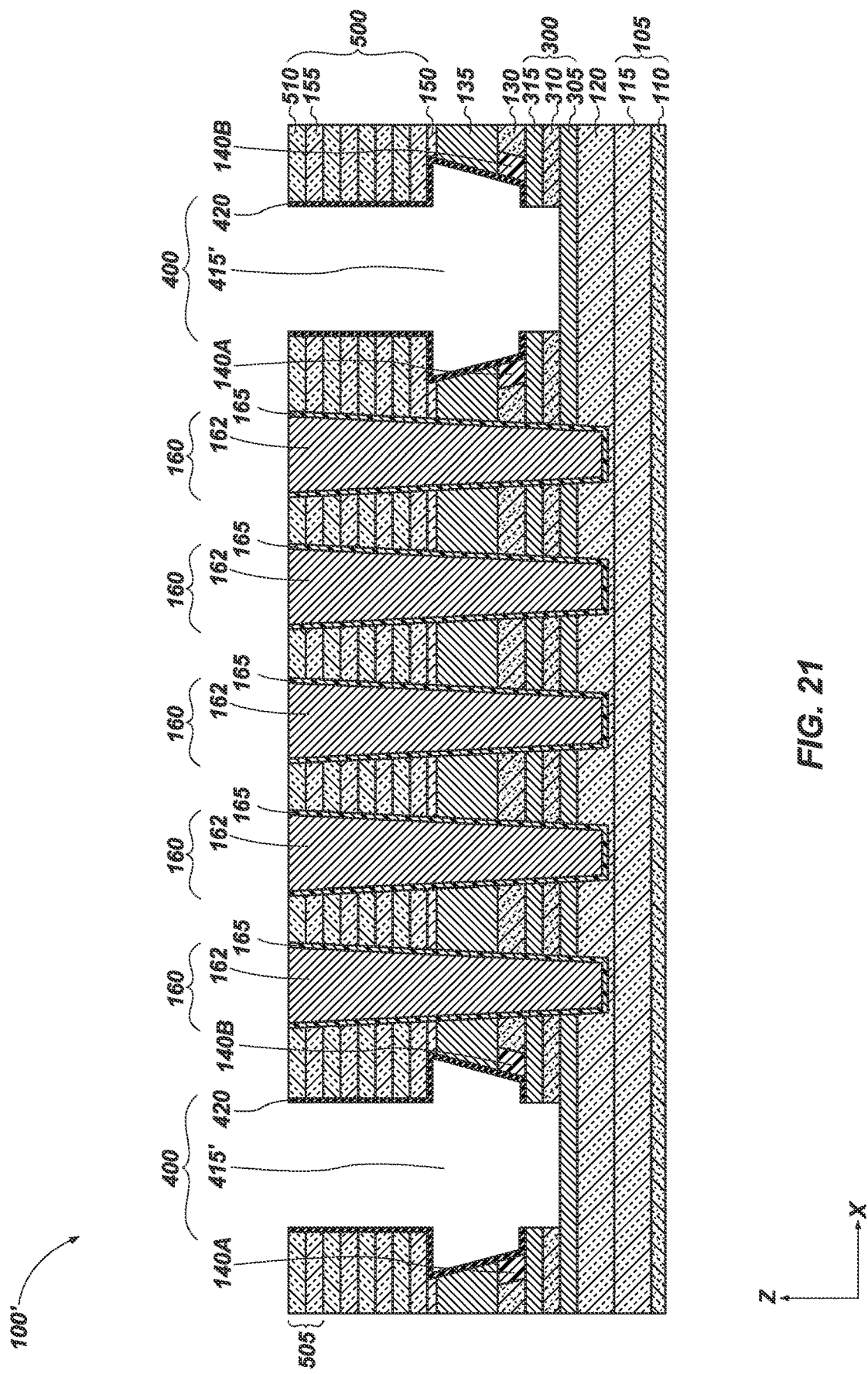
Figure 22:
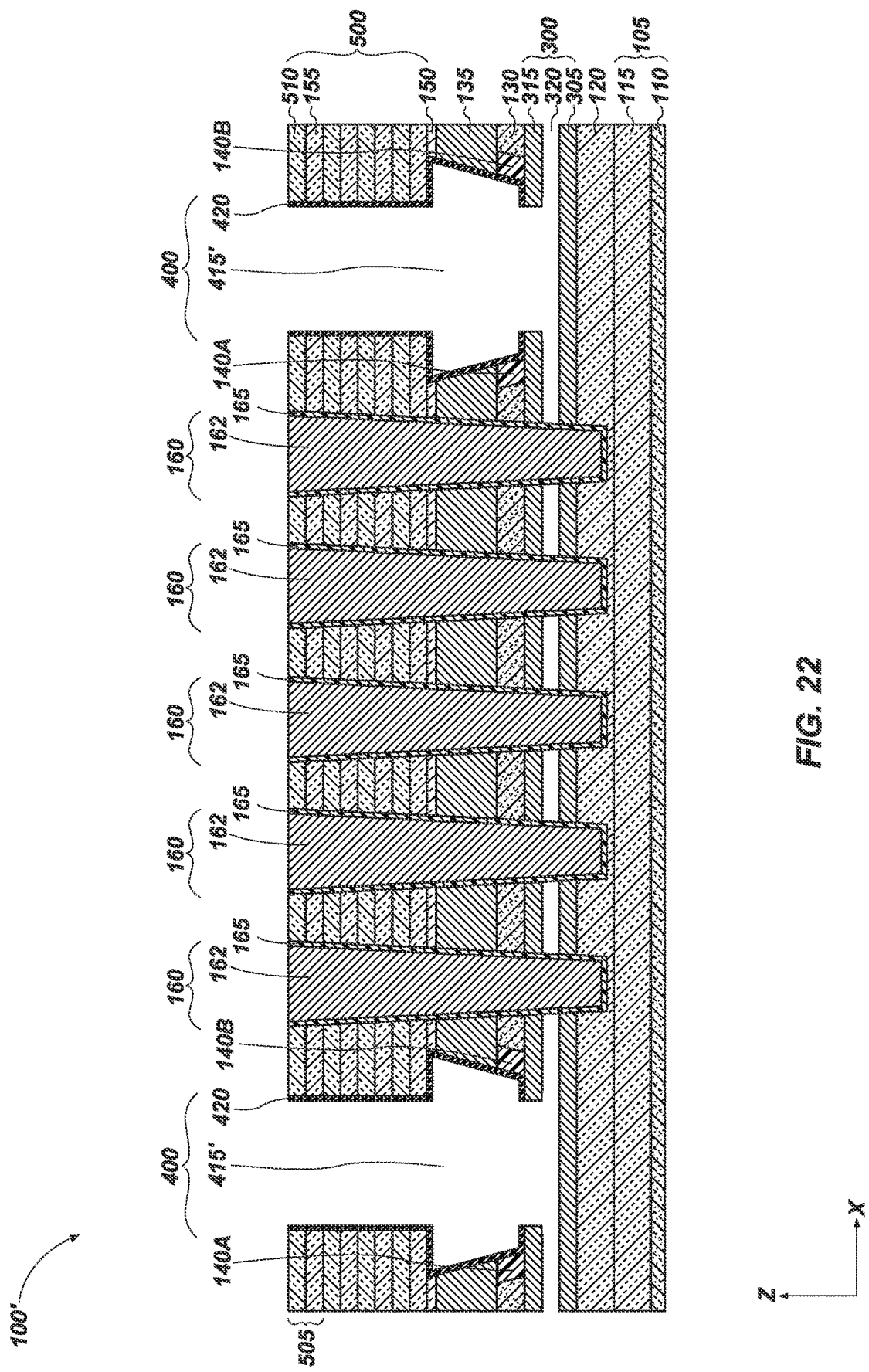
Figure 23:
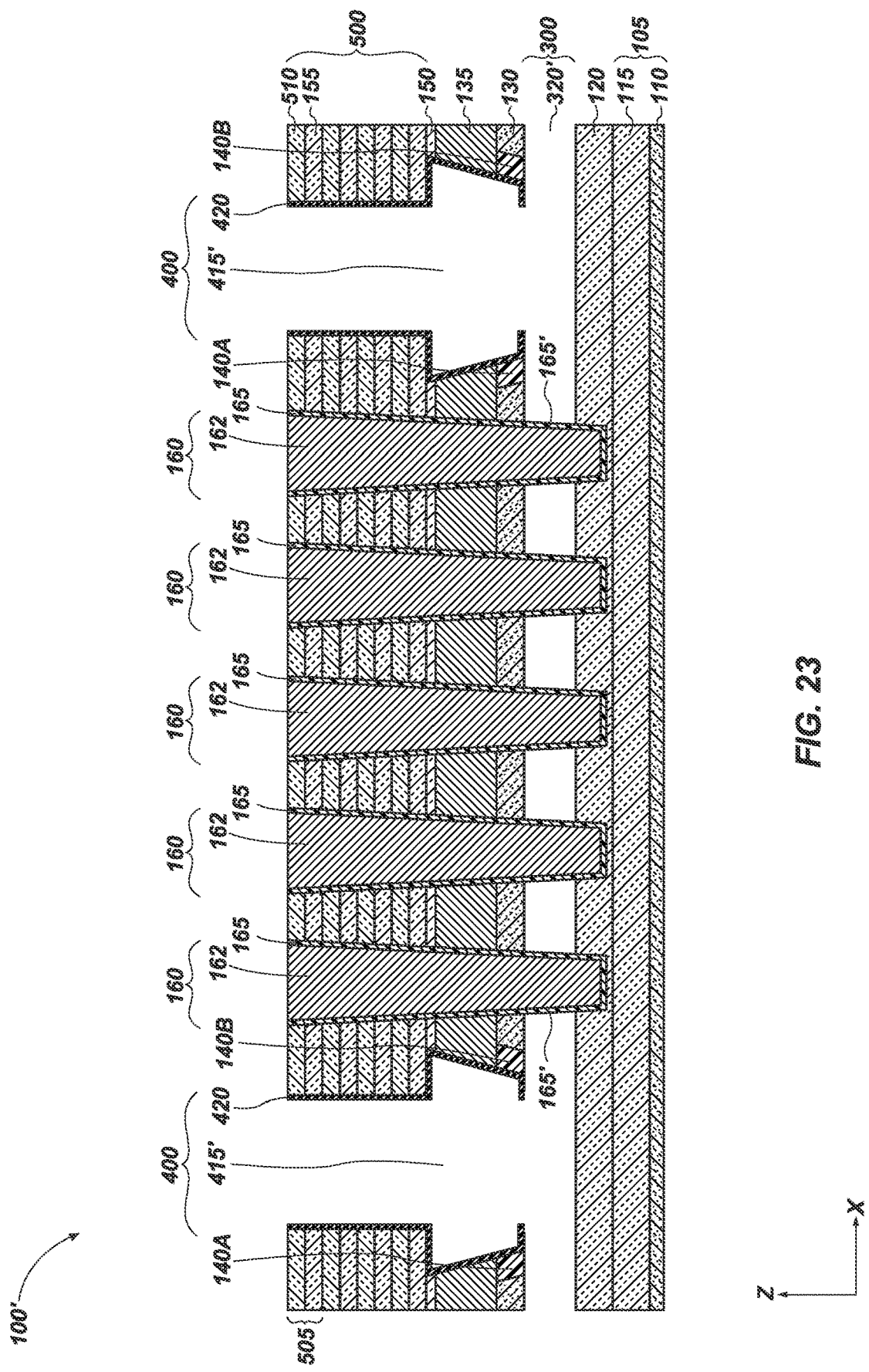
Figure 24:
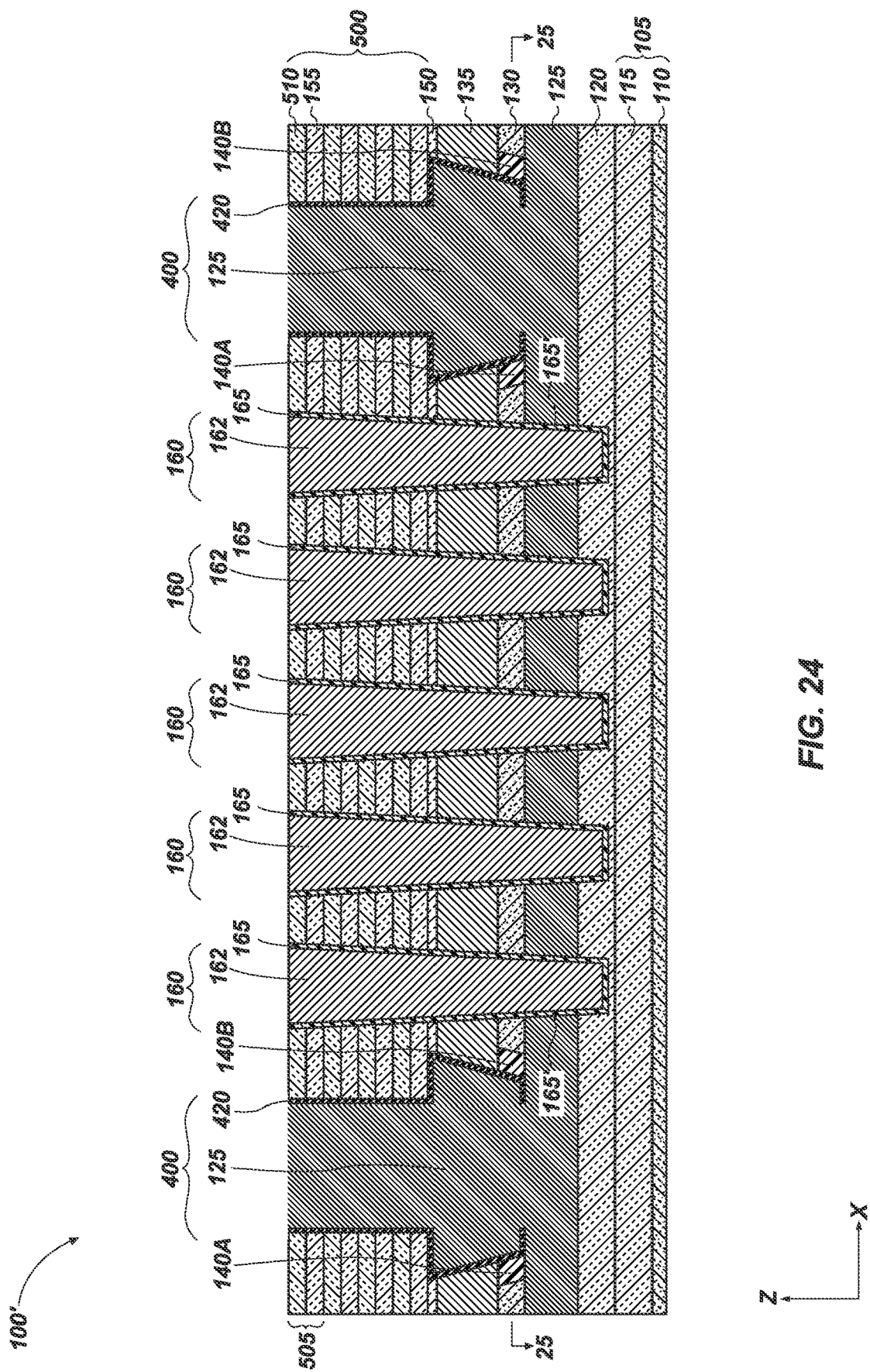
Figure 25:
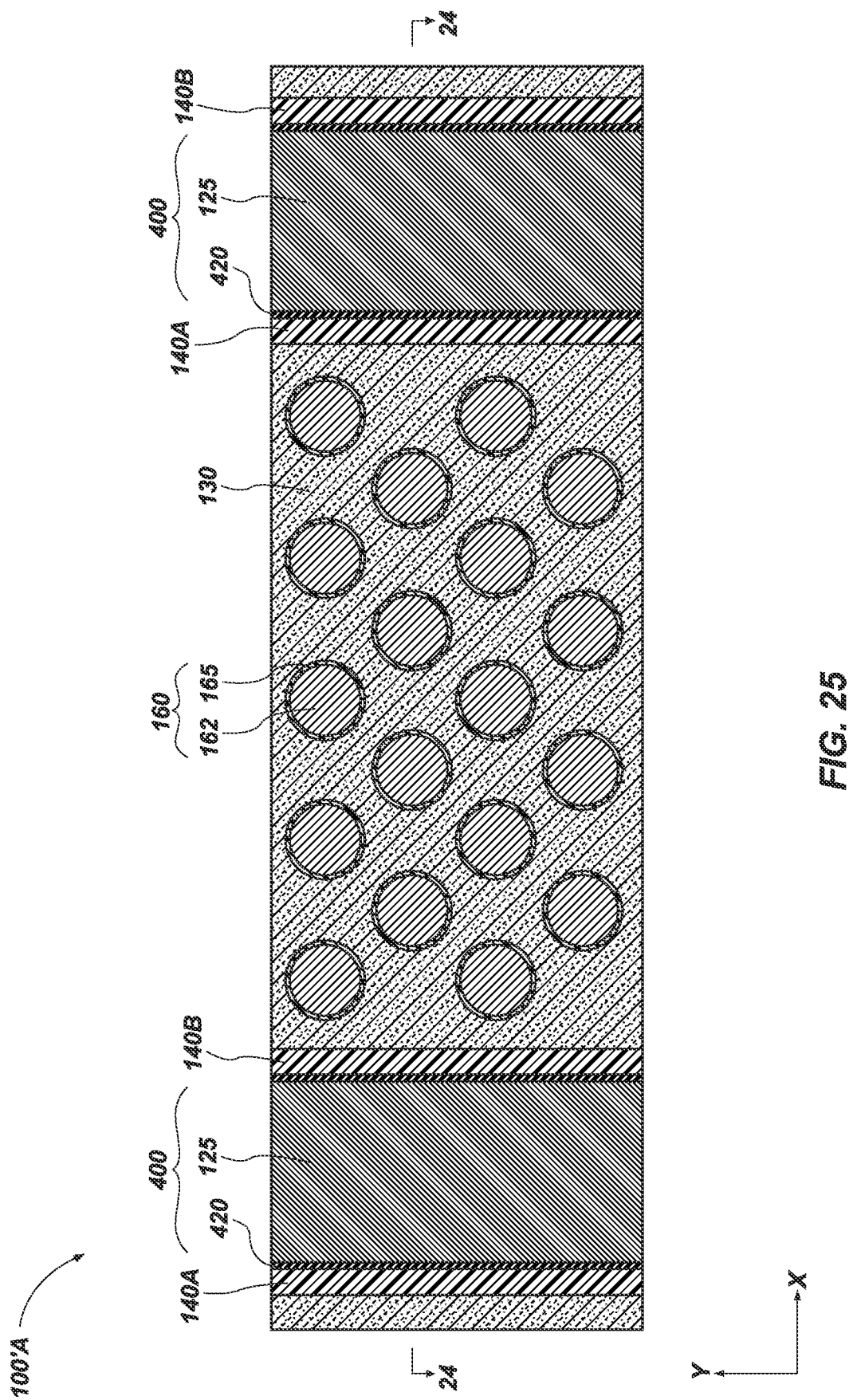

Referring to FIGS. 21 and 22, a sacrificial slit liner 420 and source contact opening 320 may be formed as described for FIGS. 11-13, with the sacrificial slit liner 420 conformally formed with the slit opening 415'. The sacrificial slit liner 420 is formed on sidewalls of both the first blocking region 140A and second blocking region 140B. The remaining portions of the source contact sacrificial structure 300 and portions of the cell films 165 are sequentially removed, as shown in FIG. 23, to provide access to the pillars 160. The materials are removed as described above for FIGS. 13 and 14. The source contact 125 is formed in the slit opening 415" and in the source contact opening 320', as shown in FIGS. 24 and 25. The materials are formed and removed as described above for FIGS. 15 and 16.

Figure 26:
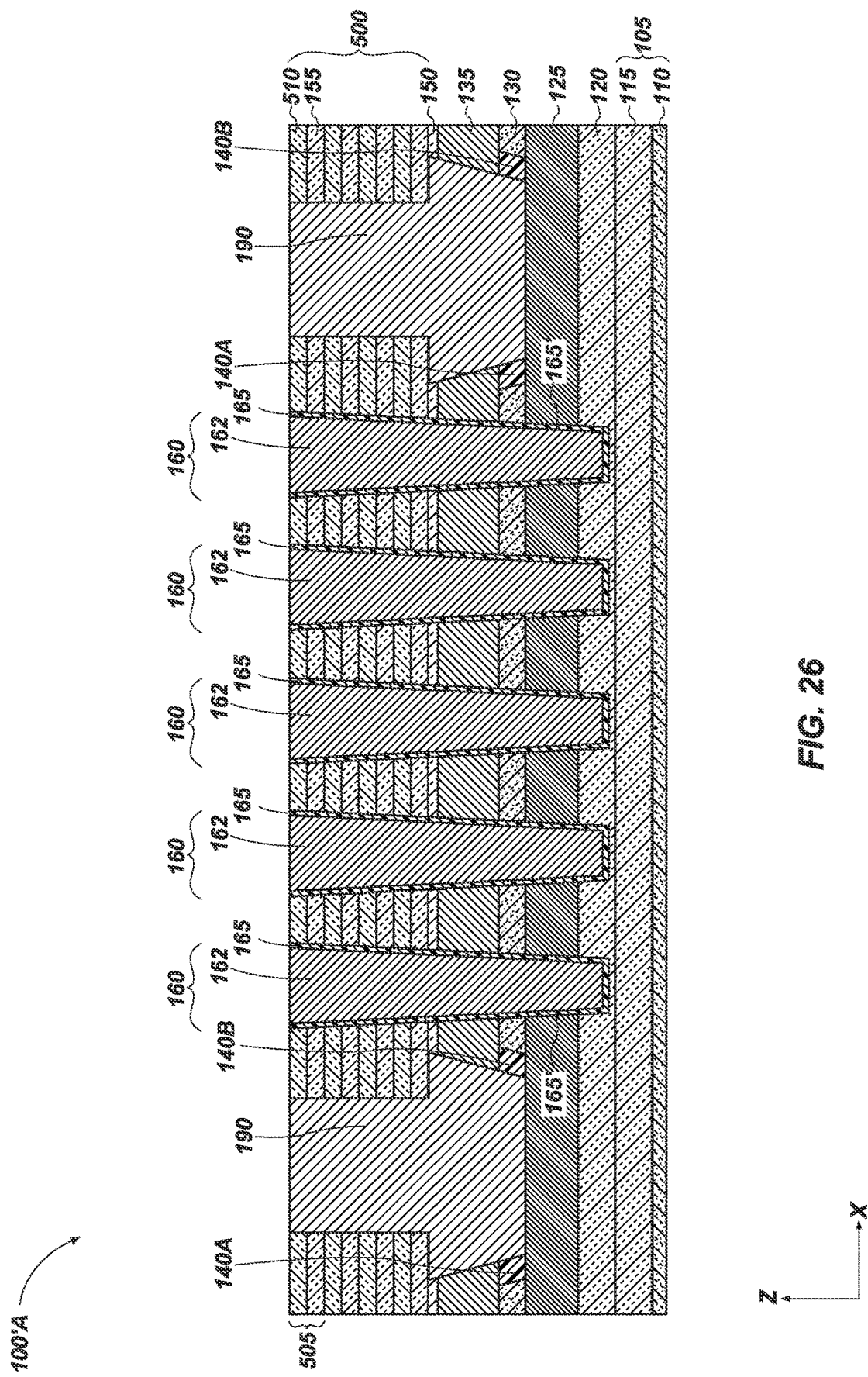
FIG. 26 is a cross-sectional, elevational, schematic illustration of the electronic device in accordance with embodiments of the disclosure formed by the process of FIGS. 19-25.

A portion of the source contact 125 is removed from within the slit opening 415' and subsequent acts are conducted to form the electronic device 100' as shown in FIG. 26. For instance, the optional oxidized portion and the second fill structure 190 are formed in the slit opening 415".

These subsequent acts are substantially similar to those described above for the electronic device 100A, shown in FIGS. 17 and 18. The electronic device 100A' may include the first blocking region 140A and second blocking region 140B laterally adjacent to each side of the second fill structure 190. The first blocking region 140A and second blocking region 140B may separate the second fill structure 190 from the doped semiconductive material 130. The source contact 125 directly contacts a lower surface of the doped semiconductive material 130, the first blocking region 140A, and the second blocking region 140B and an upper surface of the semiconductive material 120.

During formation of the electronic device 100A' according to embodiments of the disclosure, the first blocking region 140A and the second blocking region 140B protect the doped semiconductive material 130 from damage caused by subsequent process acts. Therefore, electrical performance of the electronic device 100A' according to embodiments of the disclosure is improved relative to that of conventional electronic devices having a doped semiconductive material in a similar location. The first blocking region 140A and the second blocking region 140B also provide a process margin during the fabrication of the electronic device 100A'.

The method of forming the first blocking region 140A and second blocking region 140B to protect (e.g., cap) the sidewalls of the doped semiconductive material 130 described herein provides similar advantages over conventional methods as described above for the electronic device 100 of FIGS. 1-18. Furthermore, the electronic device 100A' provides advantages over conventional structures similar to those described above for the electronic device 100A of FIGS. 1-18. By capping the sidewalls of the doped semiconductive material 130 with the first blocking region 140A and the second blocking region 140B, the doped semiconductive material 130 is protected during formation of the slit opening 415, 415'. The first blocking region 140A and second blocking region 140B on the sidewalls of the doped semiconductive material 130 also provides a process margin for forming the slit opening 145, 145', 145" and the source contact opening 320, 320'. The first blocking region 140A and second blocking region 140B also provide more reliable access to the source contact sacrificial structure 300 (e.g., first, second, and third sacrificial structures 305, 310, 315) through the slit opening 145, 145', 145". The source contact sacrificial structure 300 may be removed without removing portions of the doped semiconductive material 130, which are protected by the first blocking region 140A and the second blocking region 140B. Thus, the integrity of the doped semiconductive material 130 within the electronic device structure 100' may be maintained. Moreover, by preventing unintentional removal of the doped semiconductive material 130, the methods and structures described herein provide one or more of improved performance, reliability, durability, and lower costs as compared to conventional structures, conventional devices, and conventional systems.

Accordingly, disclosed is an electronic device comprising a source stack comprising one or more conductive materials, a source contact vertically adjacent to the source stack, and a doped semiconductive material vertically adjacent to the source contact. Tiers of alternating conductive materials and dielectric materials are vertically adjacent to the doped semiconductive material, and pillars extend through the tiers of alternating conductive materials and dielectric materials, the doped semiconductive material, and the source contact and into the source stack. One or more blocking regions are laterally adjacent to the semiconductive material.

Accordingly, also disclosed is an electronic device comprising a source contact vertically adjacent to a source stack comprising one or more conductive materials, a doped semiconductive material comprising polysilicon vertically adjacent to the source contact, and one or more blocking regions laterally adjacent to the doped semiconductive material. The one or more blocking regions comprise a metal or a metallized material of the poly silicon. Tiers of alternating conductive materials and dielectric materials are vertically adjacent to the doped semiconductive material. Pillars extend through the tiers of alternating conductive materials and dielectric materials, the doped semiconductive material, and the source contact and into the source stack.

Accordingly, disclosed is a method of forming an electronic device that comprises forming an electronic device structure comprising a source contact sacrificial structure adjacent to a source stack, a doped semiconductive material comprising a polysilicon material adjacent to the source contact sacrificial structure, and an insulative cap material adjacent to the doped semiconductive material. An opening is formed in the insulative cap material and doped semiconductive material to expose the doped semiconductive material. An exposed portion of the polysilicon material is converted into one or more blocking regions comprising a metal or a metallized material of the polysilicon material. A slit sacrificial structure is formed in the opening, and tiers comprising alternating dielectric materials and nitride materials are formed adjacent to the doped semiconductive material. Pillars are formed through the tiers, the doped semiconductive material, and the source contact sacrificial structure and into the source stack. At least a portion of the slit sacrificial structure is removed to form a slit opening that extends through the tiers and the slit sacrificial structure and exposes the source contact sacrificial structure and the one or more blocking regions. The source contact sacrificial structure is removed to form a source contact opening and a source contact is formed in the source contact opening. The nitride materials of the tiers are replaced with conductive materials and a fill material is formed in the slit opening. The one or more blocking regions are laterally adjacent to the fill material.

Figure 27:
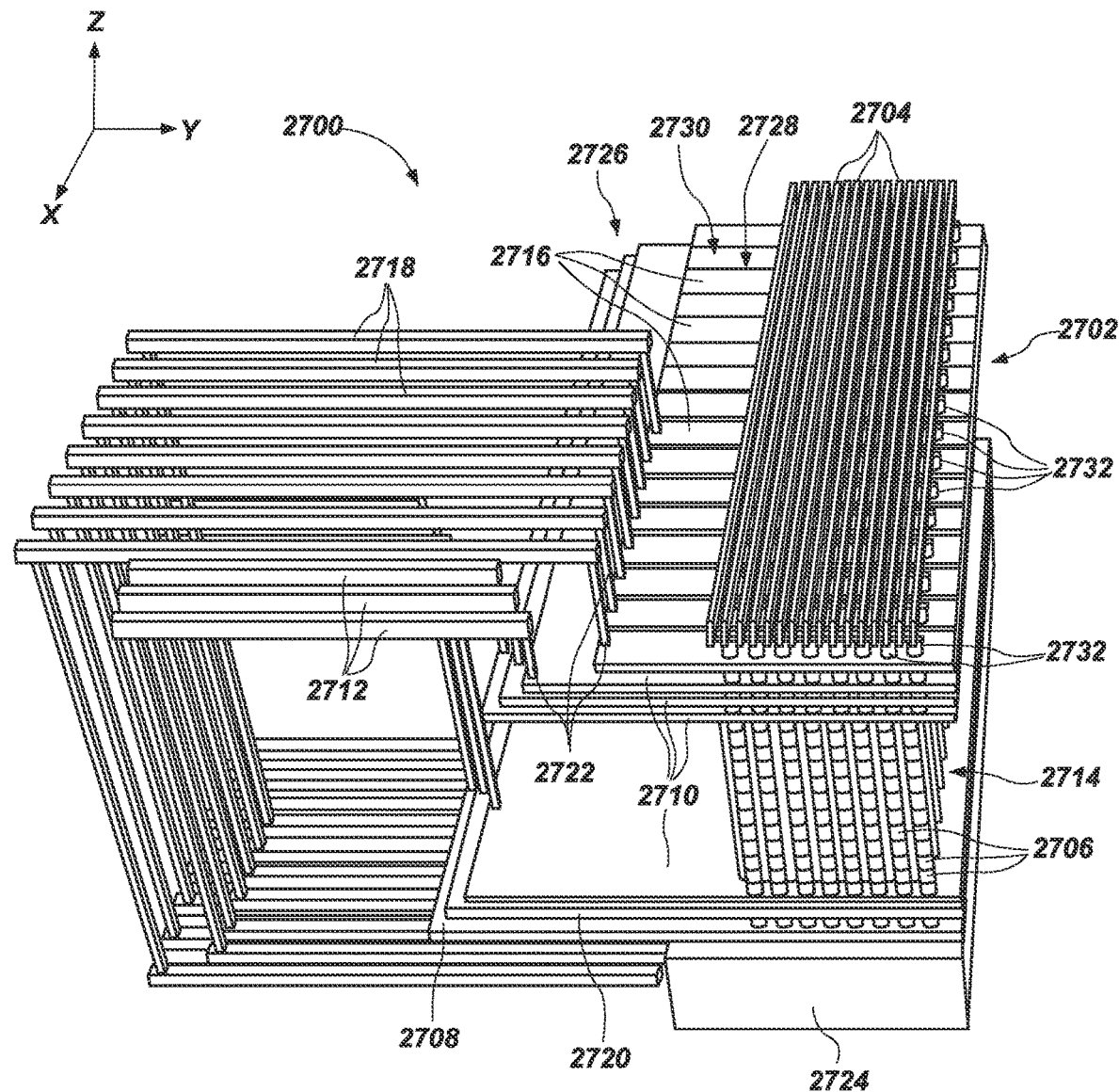
FIG. 27 is a partial, cutaway, perspective, schematic illustration of an apparatus including one or more electronic devices in accordance with embodiments of the disclosure.

With reference to FIG. 27, illustrated is a partial cutaway, perspective, schematic illustration of a portion of an apparatus 2700 (e.g., a memory device) including an electronic device 2702 according to embodiments of the disclosure. The electronic device 2702 may be substantially similar to the embodiments of the electronic device described above (e.g., the electronic device structures 100, 100' of FIGS. 17, 18, and 26) and may have been formed by the methods described above. By way of example only, the memory device may be a 3D NAND Flash memory device, such as a multideck 3D NAND Flash memory device. As illustrated in FIG. 27, the electronic device 2702 may include a staircase structure 2726 defining contact regions for connecting access lines (e.g., word lines) 2712 to conductive tiers 2710 (e.g., conductive layers, conductive materials of tiers). The electronic device 2702 may include pillars with strings 2714 (e.g., strings of memory cells 2706) that are coupled to each other in series. The pillars with the strings 2714 may extend at least somewhat vertically (e.g., in the Z-direction) and orthogonally relative to the conductive tiers 2710, relative to data lines 2704, relative to a source tier 2708 (e.g., within one or more base materials under the source stack 105), relative to the access lines 2712, relative to first select gates (e.g., upper select gates, drain select gates (SGDs)), relative to select lines 2718, and/or relative to second select gates 2720 (e.g., SGS). The first select gates 2716 may be horizontally divided (e.g., in the X-direction) into multiple blocks 2730 by slits 2728.

Vertical conductive contacts 2722 may electrically couple components to each other, as illustrated. For example, the select lines 2718 may be electrically coupled to the first select gates 2716, and the access lines 2712 may be electrically coupled to the conductive tiers 2710. The apparatus 2700 may also include a control unit 2724 positioned under the memory array, which may include at least one of string driver circuitry, pass gates, circuitry for selecting gates, circuitry for selecting conductive lines (e.g., the data lines 2704, the access lines 2712), circuitry for amplifying signals, and circuitry for sensing signals. The control unit 2724 may be electrically coupled to the data lines 2704, the source tier 2708, the access lines 2712, the first select gates 2716, and/or the second select gates 2720, for example. In some embodiments, the control unit 2724 includes CMOS (complementary metal-oxide-semiconductor) circuitry. In such embodiments, the control unit 2724 may be characterized as having a so-called "CMOS under Array" (CuA) configuration.

The first select gates 2716 may extend horizontally in a first direction (e.g., the Y-direction) and may be coupled to respective first groups of strings 2714 of memory cells 2706 at a first end (e.g., an upper end) of the strings 2714. The second select gate 2720 may be formed in a substantially planar configuration and may be coupled to the strings 2714 at a second, opposite end (e.g., a lower end) of the strings 2714 of memory cells 2706.

The data lines 2704 (e.g., bit lines) may extend horizontally in a second direction (e.g., in the X-direction) that is at an angle (e.g., perpendicular) to the first direction in which the first select gates 2716 extend. The data lines 2704 may be coupled to respective second groups of the strings 2714 at the first end (e.g., the upper end) of the strings 2714. A first group of strings 2714 coupled to a respective first select gate 2716 may share a particular string 2714 with a second group of strings 2714 coupled to a respective data line 2704. Thus, a particular string 2714 may be selected at an intersection of a particular first select gate 2716 and a particular data line 2704. Accordingly, the first select gates 2716 may be used for selecting memory cells 2706 of the strings 2714 of memory cells 2706.

The conductive tiers 2710 (e.g., conductive structures 180 (see FIGS. 17 and 18)) may extend in respective horizontal planes. The conductive tiers 2710 may be stacked vertically, such that each conductive tier 2710 is coupled to all of the strings 2714 of memory cells 2706, and the strings 2714 of the memory cells 2706 extend vertically through the stack of conductive tiers 2710. The conductive tiers 2710 may be coupled to or may function as control gates of the memory cells 2706 to which the conductive tiers 2710 are coupled. Each conductive tier 2710 may be coupled to one memory cell 2706 of a particular string 2714 of memory cells 2706. The first select gates 2716 and the second select gates 2720 may operate to select a particular string 2714 of the memory cells 2706 between a particular data line 2704 and the source tier 2708. Thus, a particular memory cell 2706 may be selected and electrically coupled to a data line 2704 by operation of (e.g., by selecting) the appropriate first select gate 2716, second select gate 2720, and conductive tier 2710 that are coupled to the particular memory cell 2706.

The staircase structure 2726 may be configured to provide electrical connection between the access lines 2712 and the conductive materials of the tiers 2710 through the vertical conductive contacts 2722. In other words, a particular level of the conductive tiers 2710 may be selected via one of the access lines 2712 that is in electrical communication with a respective one of the vertical conductive contacts 2722 in electrical communication with the particular conductive tier 2710. The data lines 2704 may be electrically coupled to the strings 2714 through conductive structures 2732 (e.g., conductive contacts).

Figure 28:
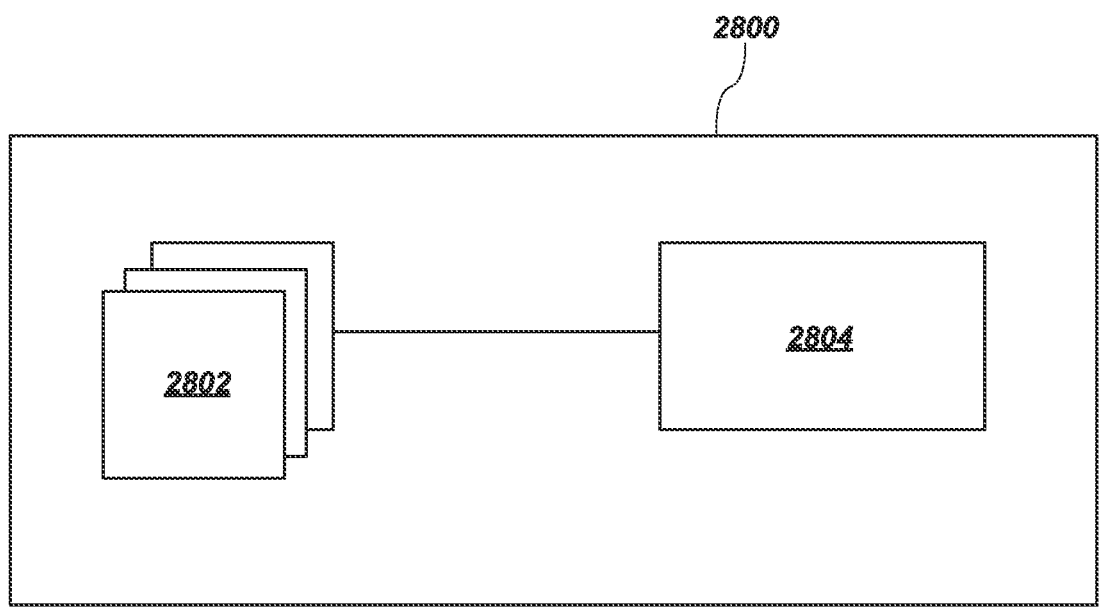
FIG. 28 is a block diagram of an electronic system including one or more electronic devices in accordance with embodiments of the disclosure.

The apparatus 2700 including the electronic device structures 100, 100' may be used in embodiments of electronic systems of the disclosure. FIG. 28 is a block diagram of an electronic system 2800, in accordance with embodiments of the disclosure. The electronic system 2800 includes, for example, a computer or computer hardware component, a server or other networking hardware component, a cellular telephone, a digital camera, a personal digital assistant (PDA), a portable media (e.g., music) player, a Wi-Fi or cellular-enabled tablet (e.g., an iPAD® or SURFACE® tablet, an electronic book, a navigation device), etc. The electronic system 2800 includes at least one memory device 2802 that includes, for example, one or more electronic device structures 100, 100'. The electronic system 2800 may further include at least one electronic signal processor device 2804 (e.g., a microprocessor). The electronic signal processor device 2804 may, optionally, include one or more electronic device structures 100, 100'.

Figure 29:
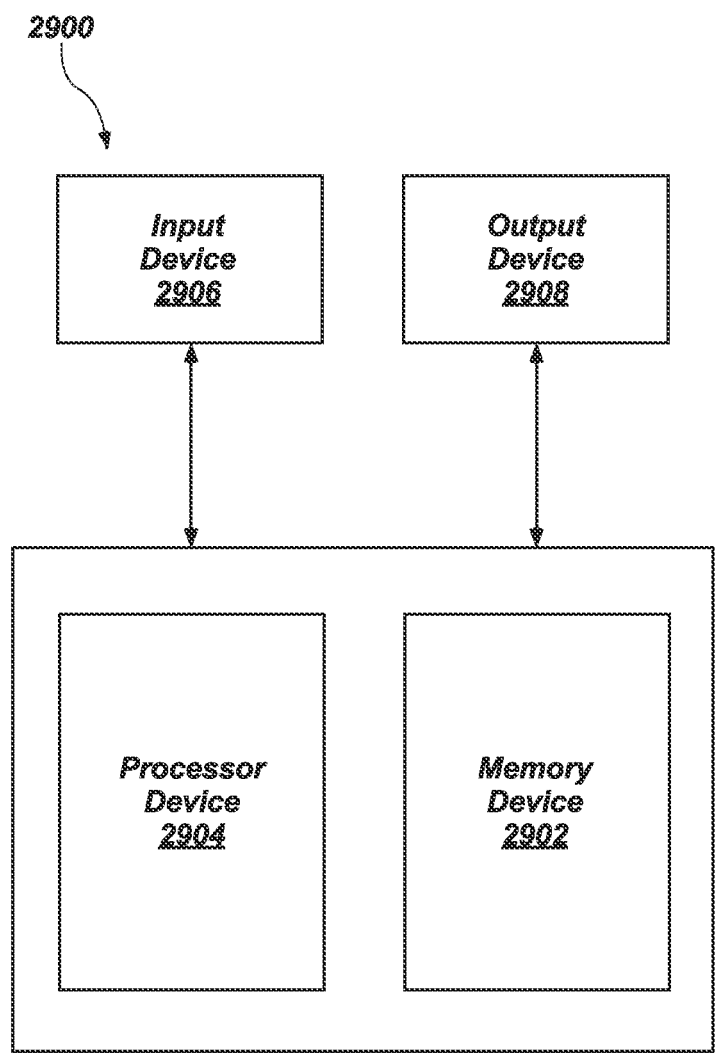
FIG. 29 is a block diagram of a processor-based system including one or more electronic devices in accordance with embodiments of the disclosure.

A processor-based system 2900 (e.g., an electronic processor-based system 2900), shown in FIG. 29, includes one or more input devices 2906 for inputting information into the processor-based system 2900 by a user, such as, for example, a mouse or other pointing device, a keyboard, a touchpad, a button, or a control panel. The processor-based system 2900 may further include one or more output devices 2908 for outputting information (e.g., visual or audio output) to a user such as, for example, a monitor, a display, a printer, an audio output jack, a speaker, etc. In some embodiments, the input device 2906 and the output device 2908 may comprise a single touchscreen device that can be used both to input information into the processor-based system 2900 and to output visual information to a user. The input device 2906 and the output device 2908 may communicate electrically with one or more of the memory device 2902 and the electronic signal processor device 2904. The memory device 2902 and the electronic signal processor device 2904 may include one or more of the electronic device structures 100, 100'.

Figure 30:
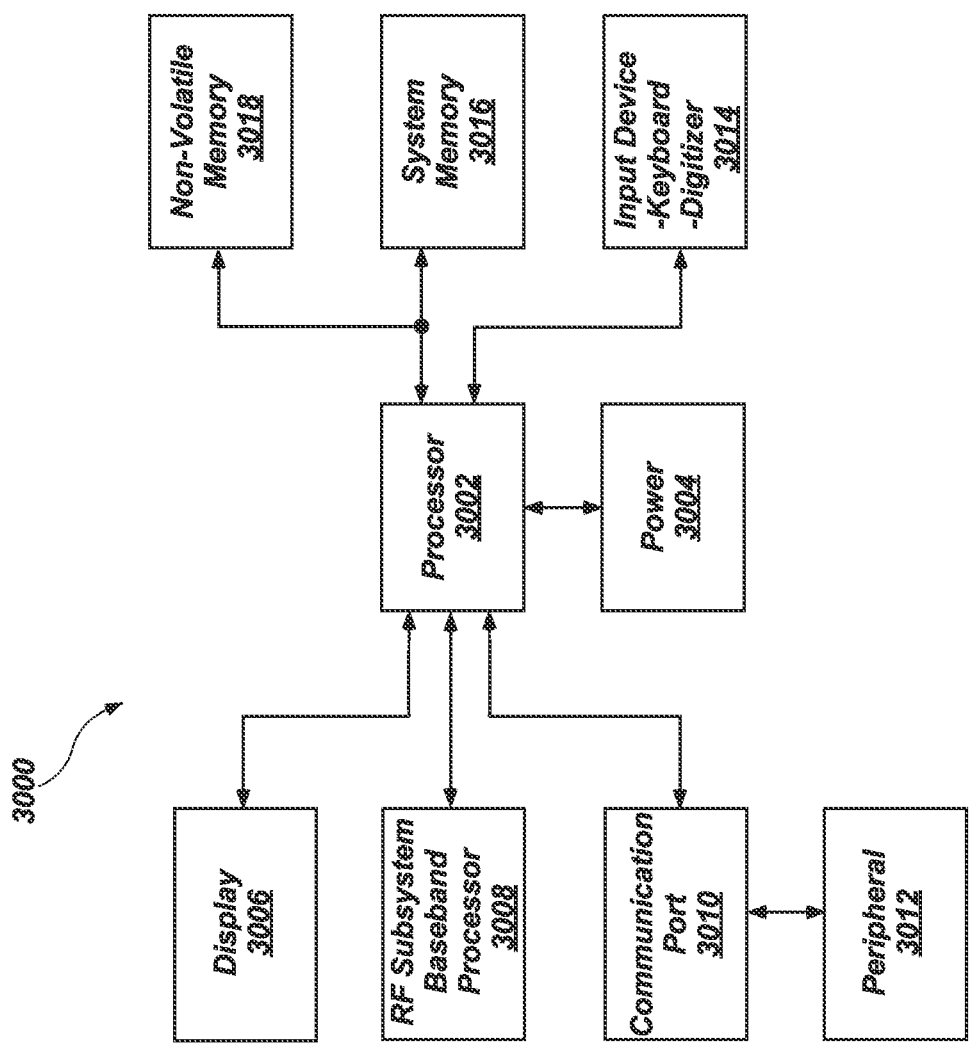
FIG. 30 is a block diagram of another processor-based system including one or more electronic devices in accordance with embodiments of the disclosure.

With reference to FIG. 30, shown is a block diagram of an additional processor-based system 3000 (e.g., an electronic processor-based system 3000). The processor-based system 3000 may include various electronic device structures 100A, 100A' and apparatus 2700 manufactured in accordance with embodiments of the disclosure. The processor-based system 3000 may be any of a variety of types, such as a computer, a pager, a cellular phone, a personal organizer, a control circuit, or another electronic device. The processor-based system 3000 may include one or more processors 3002, such as a microprocessor, to control the processing of system functions and requests in the processor-based system 3000. The processor 3002 and other subcomponents of the processor-based system 3000 may include electronic device structures 100, 100' and apparatus 2700 manufactured in accordance with embodiments of the disclosure.

The processor-based system 3000 may include a power supply 3004 in operable communication with the processor 3002. For example, if the processor-based system 3000 is a portable system, the power supply 3004 may include one or more of a fuel cell, a power scavenging device, permanent batteries, replaceable batteries, and/or rechargeable batteries. The power supply 3004 may also include an AC adapter if, for example, the processor-based system 3000 may be plugged into a wall outlet. The power supply 3004 may also include a DC adapter such that the processor-based system 3000 may be plugged into a vehicle cigarette lighter or a vehicle power port, for example.

Various other devices may be coupled to the processor 3002 depending on the functions that the processor-based system 3000 performs. For example, a user interface may be coupled to the processor 3002. The user interface may include one or more input devices 3014, such as buttons, switches, a keyboard, a light pen, a mouse, a digitizer and stylus, a touch screen, a voice recognition system, a microphone, or a combination thereof. A display 3006 may also be coupled to the processor 3002. The display 3006 may include an LCD display, an SED display, a CRT display, a DLP display, a plasma display, an OLED display, an LED display, a three-dimensional projection, an audio display, or a combination thereof. Furthermore, an RF subsystem/baseband processor 3008 may also be coupled to the processor 3002. The RF subsystem/baseband processor 3008 may include an antenna that is coupled to an RF receiver and to an RF transmitter. A communication port 3010, or more than one communication port 3010, may also be coupled to the processor 3002. The communication port 3010 may be adapted to be coupled to one or more peripheral devices 3012 (e.g., a modem, a printer, a computer, a scanner, a camera) and/or to a network (e.g., a local area network (LAN), a remote area network, an intranet, or the Internet).

The processor 3002 may control the processor-based system 3000 by implementing software programs stored in the memory (e.g., system memory 3016). The software programs may include an operating system, database software, drafting software, word processing software, media editing software, and/or media-playing software, for example. The memory is operably coupled to the processor 3002 to store and facilitate execution of various programs. For example, the processor 3002 may be coupled to system memory 3016, which may include one or more of spin torque transfer magnetic random access memory (STT-MRAM), magnetic random access memory (MRAM), dynamic random access memory (DRAM), static random access memory (SRAM), racetrack memory, and/or other known memory types. The system memory 3016 may include volatile memory, nonvolatile memory, or a combination thereof. The system memory 3016 is typically large so it can store dynamically loaded applications and data. The system memory 3016 may include one or more apparatus 2700 and one or more electronic device structures 100, 100' according to embodiments of the disclosure.

The processor 3002 may also be coupled to non-volatile memory 3018, which is not to suggest that system memory 3016 is necessarily volatile. The non-volatile memory 3018 may include one or more of STT-MRAM, MRAM, read-only memory (ROM) (e.g., EPROM, resistive read-only memory (RROM)), and Flash memory to be used in conjunction with the system memory 3016. The size of the non-volatile memory 3018 is typically selected to be just large enough to store any necessary operating system, application programs, and fixed data. Additionally, the non-volatile memory 3018 may include a high-capacity memory (e.g., disk drive memory, such as a hybrid-drive including resistive memory or other types of nonvolatile solid-state memory, for example). The non-volatile memory 3018 may include one or more apparatus 2700 and one or more electronic device structures 100A, 100A' according to embodiments of the disclosure.

Accordingly, disclosed is an electronic system comprising an input device, an output device, a processor device operably coupled to the input device and to the output device, and one or more memory devices operably coupled to the processor device. The one or more memory devices comprises a source stack comprising one or more conductive materials, a source contact vertically adjacent to the source stack, and a doped semiconductive material vertically adjacent to the source contact. Tiers of alternating conductive materials and dielectric materials are vertically adjacent to the doped semiconductive material, and memory pillars extend through the tiers of alternating conductive materials and dielectric materials and to the source stack. A fill material is laterally adjacent to the memory pillars. The fill material extends through the tiers of alternating conductive materials and dielectric materials and to the source contact. One or more blocking regions are between the doped semiconductive material and the fill material.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. An electronic device, comprising:
  a source stack comprising one or more conductive materials;
  a source contact vertically adjacent to the source stack;
  a doped semiconductive material directly vertically adjacent to the source contact;
  tiers of alternating conductive materials and dielectric materials vertically adjacent to the doped semiconductive material;
  pillars comprising a blocking material extending through the tiers of alternating conductive materials and dielectric materials, the doped semiconductive material, and the source contact and into the source stack; and
  one or more blocking regions laterally adjacent to the doped semiconductive material.

2. The electronic device of claim 1, further comprising a fill material vertically adjacent to the source contact, the fill material extending through the tiers of alternating conductive materials and dielectric materials and the doped semiconductive material.

3. The electronic device of claim 2, wherein the one or more blocking regions are laterally interposed between the fill material and the doped semiconductive material.

4. The electronic device of claim 2, wherein one blocking region is laterally adjacent to the fill material.

5. The electronic device of claim 2, wherein two blocking regions are laterally adjacent to the fill material, the two blocking regions on opposite sides of the fill material.

6. The electronic device of claim 1, wherein the one or more blocking regions comprises titanium, titanium silicide, titanium cobalt silicide, tungsten, tungsten nitride, tungsten nitride silicide, tungsten silicide, or a combination thereof.

7. The electronic device of claim 1, wherein the one or more blocking regions comprises multiple phases of titanium, titanium silicide, titanium cobalt silicide, tungsten, tungsten nitride, tungsten nitride silicide, tungsten silicide, or a combination thereof.

8. The electronic device of claim 1, wherein the one or more blocking regions comprises tungsten silicide.

9. An electronic device, comprising:
  a source contact vertically adjacent to a source stack comprising one or more conductive materials;
  a doped semiconductive material comprising polysilicon directly vertically adjacent to the source contact;
  one or more blocking regions laterally adjacent to the doped semiconductive material, the one or more blocking regions comprising a metal or a metallized material of the polysilicon;
  tiers of alternating conductive materials and dielectric materials vertically adjacent to the doped semiconductive material; and
  pillars comprising a blocking material extending through the tiers of alternating conductive materials and dielectric materials, the doped semiconductive material, and the source contact and into the source stack.

10. The electronic device of claim 9, wherein the one or more blocking regions comprises a homogeneous composition.

11. The electronic device of claim 9, wherein the one or more blocking regions comprises a heterogeneous composition.

12. The electronic device of claim 11, wherein the heterogeneous composition of the one or more blocking regions comprises a gradient of silicon atoms.

13. The electronic device of claim 9, wherein a portion of the one or more blocking regions proximal to the doped semiconductive material exhibits a different chemical composition than a portion of the one or more blocking regions distal to the doped semiconductive material.

14. The electronic device of claim 13, wherein the one or more blocking regions comprises a gradient of silicon atoms in tungsten silicide.

15. The electronic device of claim 9, further comprising a fill material, the one or more blocking regions between the doped semiconductive material and the fill material.

16. An electronic system, comprising:
  an input device;
  an output device;
  a processor device; and
  one or more memory devices operable coupled to the processor device, the one or more memory devices comprising:
    a source stack comprising one or more conductive materials;
    a source contact vertically adjacent to the source stack;
    a doped semiconductive material directly vertically adjacent to the source contact;
    tiers of alternating conductive materials and dielectric materials vertically adjacent to the doped semiconductive material;
    memory pillars extending through the tiers of alternating conductive materials and dielectric materials and into the source stack;
    a fill material laterally adjacent to the memory pillars, the fill material extending through the tiers of alternating conductive materials and dielectric materials and to the source contact; and
    one or more blocking regions between the doped semiconductive material and the fill material.

17. A method of forming an electronic device, the method comprising:
- forming an electronic device structure comprising a source contact sacrificial structure adjacent to a source stack, a doped semiconductive material comprising a polysilicon material directly vertically adjacent to the source contact sacrificial structure, and an insulative cap material adjacent to the doped semiconductive material;
- forming an opening in the insulative cap material and doped semiconductive material to expose the doped semiconductive material;
- converting an exposed portion of the polysilicon material into one or more blocking regions comprising a metal or a metallized material of the polysilicon material;
- forming a slit sacrificial structure in the opening;
- forming tiers adjacent to the doped semiconductive material, the tiers comprising alternating dielectric materials and nitride materials;
- forming pillars comprising a blocking material through the tiers, the doped semiconductive material, and the source contact sacrificial structure and into the source stack;
- removing at least a portion of the slit sacrificial structure to form a slit opening extending through the tiers and the slit sacrificial structure and exposing the source contact sacrificial structure and the one or more blocking regions;
- removing the source contact sacrificial structure to form a source contact opening;
- forming a source contact in the source contact opening;
- replacing the nitride materials of the tiers with conductive materials; and
- forming a fill material in the slit opening, the one or more blocking regions laterally adjacent to the fill material.

18. The method of claim 17, wherein converting an exposed portion of the polysilicon material into one or more blocking regions comprises forming the one or more blocking regions laterally adjacent to the doped semiconductive material.

19. The method of claim 17, wherein converting an exposed portion of the polysilicon material into one or more blocking regions comprises forming a gradient of silicon in the one or more blocking regions.

20. The method of claim 17, wherein converting an exposed portion of the polysilicon material into one or more blocking regions comprises forming the one or more blocking regions comprising titanium, titanium silicide, titanium cobalt silicide, tungsten, tungsten nitride, tungsten nitride silicide, tungsten silicide, or a combination thereof.

21. The method of claim 17, wherein converting an exposed portion of the polysilicon material into one or more blocking regions comprises forming the one or more blocking regions comprising a tungsten-containing material or a titanium-containing material.

22. The method of claim 17, wherein forming a fill material in the slit opening comprises forming the fill material in direct contact with one blocking region.

23. The method of claim 22, wherein forming the fill material in direct contact with one blocking region comprises forming the one blocking region separating the doped semiconductive material and the fill material.

24. The method of claim 17, wherein forming a fill material in the slit opening comprises forming the fill material in direct contact with two blocking regions.

25. The method of claim 24, wherein forming the fill material in direct contact with two blocking region comprises forming the two blocking regions separating the doped semiconductive material and the fill material.

* * * * *